(12) United States Patent
Kimura et al.

(10) Patent No.: US 12,386,528 B2
(45) Date of Patent: Aug. 12, 2025

(54) SEMICONDUCTOR MEMORY DEVICE CONTROLLING ERASE OPERATION

(71) Applicant: Kioxia Corporation, Tokyo (JP)

(72) Inventors: Keita Kimura, Fujisawa Kanagawa (JP); Kenri Nakai, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 151 days.

(21) Appl. No.: 17/931,265

(22) Filed: Sep. 12, 2022

(65) Prior Publication Data
US 2023/0297255 A1 Sep. 21, 2023

(30) Foreign Application Priority Data
Mar. 18, 2022 (JP) .................. 2022-044009

(51) Int. Cl.
*G06F 3/06* (2006.01)
(52) U.S. Cl.
CPC .......... *G06F 3/0625* (2013.01); *G06F 3/0653* (2013.01); *G06F 3/0679* (2013.01)
(58) Field of Classification Search
CPC .... G06F 3/0625; G06F 3/0679; G06F 3/0653; G11C 16/344; G11C 16/3445; G11C 11/5635; G11C 16/14; G11C 16/16
USPC .................. 711/154, 103, 100, 166, 12.008; 365/185.22, 185.3, 185.29, 185.24
See application file for complete search history.

(56) References Cited

U.S. PATENT DOCUMENTS

| | | | |
|---|---|---|---|
| 8,194,467 B2 | 6/2012 | Mikajiri et al. | |
| 8,929,149 B2 | 1/2015 | Shim | |
| 9,001,589 B2 | 4/2015 | Baek | |
| 10,381,095 B1* | 8/2019 | Date | G11C 16/16 |
| 11,646,086 B2* | 5/2023 | Mun | G11C 16/3445 |
| | | | 365/185.22 |
| 2012/0269001 A1* | 10/2012 | Ueno | G11C 16/16 |
| | | | 365/185.22 |
| 2014/0153340 A1 | 6/2014 | Baek | |
| 2015/0103597 A1* | 4/2015 | Park | G11C 16/14 |
| | | | 365/185.33 |
| 2019/0122741 A1* | 4/2019 | Cheng | G11C 16/3495 |
| 2020/0111535 A1* | 4/2020 | Han | G11C 16/16 |

(Continued)

FOREIGN PATENT DOCUMENTS

| | | |
|---|---|---|
| CN | 103854701 B | 8/2019 |
| JP | 4975794 B2 | 7/2012 |

*Primary Examiner* — Jared I Rutz
*Assistant Examiner* — Edward Waddy, Jr.
(74) *Attorney, Agent, or Firm* — Finnegan, Henderson, Farabow, Garrett & Dunner, LLP

(57) ABSTRACT

According to one embodiment, a semiconductor memory device includes memory cells and a control circuit configured to control an erase operation on the memory cells. The control circuit sequentially executes, in the erase operation, a first erase process, a first erase verify process, a second erase process, and a second erase verify process on the memory cells, acquires, in the first erase verify process, first memory cells having a threshold voltage equal to or lower than a first verify voltage, from among the memory cells, acquires, in the second erase verify process, the number of second memory cells having a threshold voltage higher than the first verify voltage, from among the first memory cells, and determines whether the number of the second memory cells is larger than a first value or not.

20 Claims, 18 Drawing Sheets

(56) References Cited

U.S. PATENT DOCUMENTS

| | | | |
|---|---|---|---|
| 2020/0381057 A1* | 12/2020 | Park | G06F 3/0652 |
| 2021/0335434 A1 | 10/2021 | Jung et al. | |
| 2023/0154543 A1* | 5/2023 | Huang | G11C 16/16 |
| | | | 365/185.17 |

* cited by examiner

SEMICONDUCTOR MEMORY DEVICE CONTROLLING ERASE OPERATION

CROSS-REFERENCE TO RELATED APPLICATIONS

This application is based upon and claims the benefit of priority from Japanese Patent Application No. 2022-044009, filed Mar. 18, 2022, the entire contents of which are incorporated herein by reference.

FIELD

Embodiments described herein relate generally to a semiconductor memory device.

BACKGROUND

A NAND flash memory capable of storing data in a nonvolatile manner has been known.

DETAILED DESCRIPTION

Figure 1:
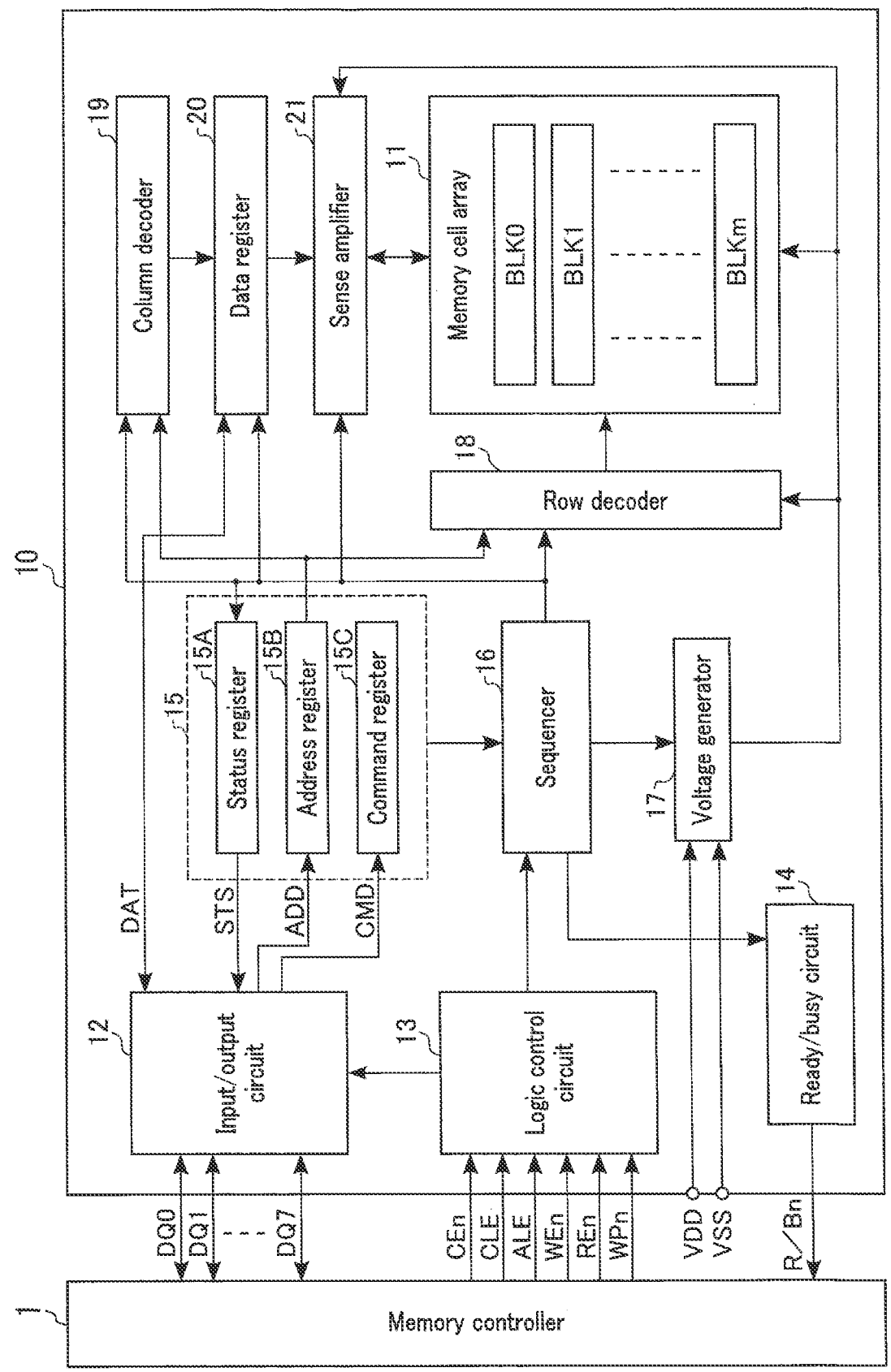
FIG. 1 is a block diagram illustrating a configuration of a semiconductor memory device of a first embodiment.

In general, according to one embodiment, a semiconductor memory device includes a plurality of memory cells and a control circuit configured to control an erase operation on the memory cells. The erase operation including an erase process and an erase verify process. The erase process applies an erase voltage to the memory cells. The erase verify process determines a threshold voltage of each of the memory cells after the erase process. The control circuit sequentially executes, in the erase operation, a first erase process, a first erase verify process, a second erase process, and a second erase verify process on the memory cells, acquires, in the first erase verify process, first memory cells having a threshold voltage equal to or lower than a first verify voltage, from among the memory cells, acquires, in the second erase verify process, the number of second memory cells having a threshold voltage higher than the first verify voltage, from among the first memory cells, and determines whether the number of the second memory cells is larger than a first value or not.

Embodiments will be described below with reference to the attached drawings. In the following description, components having the same function and configuration are denoted by the same reference numerals. The following embodiments merely exemplify apparatuses and methods for embodying the technical idea of this disclosure, and do not limit material, shape, structure, arrangement, and so forth to those described below.

1. First Embodiment

A semiconductor memory device of a first embodiment will be described. The following description will be made on a semiconductor memory device, exemplified by a three-dimensional stacked NAND flash memory in which memory cell transistors are stacked three-dimensionally above a semiconductor substrate. The NAND flash memory is a semiconductor memory capable of storing data in a nonvolatile manner.

1.1 Configuration of First Embodiment 1.1.1 Configuration of Semiconductor Memory Device A configuration of a semiconductor memory device of a first embodiment will be described. FIG. 1 is a block diagram illustrating the configuration of the semiconductor memory device of the first embodiment.

A semiconductor memory device 10 includes a memory cell array 11, an input/output circuit 12, a logic control circuit 13, a ready/busy circuit 14, a register group 15, a sequencer (or, a control circuit) 16, a voltage generator 17, a row decoder 18, a column decoder 19, a data register 20, and a sense amplifier 21. The register group 15 has a status register 15A, an address register 15B, and a command register 15C.

The memory cell array 11 includes one or a plurality of blocks BLK0, BLK1, BLK2, . . . , and BLKm (m represents a natural number of 0 or larger). Each of the blocks BLK0 to BLKm has a plurality of memory cell transistors (also referred to as a memory cell, hereinafter) associated with a row and a column. The memory cell transistor is an electrically erasable and writable (or, programmable) nonvolatile memory cell. The memory cell array 11 has a plurality of word lines, a plurality of bit lines, and a source line, through which voltage is applied to the memory cell transistor. Specific configuration of the block BLKm will be described later.

The input/output circuit 12 and the logic control circuit 13 are connected to the memory controller 1, via the input/output terminals (or, a NAND bus). The input/output circuit 12 transmits and receives I/O signals DQ (DQ0, DQ1, DQ2, . . . , DQ7, for example) to and from the memory controller 1, via input/output terminals. The I/O signals DQ are used for communication of command, address, data, and so forth.

The logic control circuit 13 receives external control signals from the memory controller 1, via the input/output terminals (or, the NAND bus). The external control signals typically include chip enable signal CEn, command latch enable signal CLE, address latch enable signal ALE, write enable signal WEn, read enable signal REn, and write protect signal WPn. The letter "n" appended to the signal name indicates that the signal is active-low.

In a case where there are a plurality of semiconductor memory devices 10, the chip enable signal CEn enables selection of the semiconductor memory device 10, and is asserted when such semiconductor memory device 10 is selected. The command latch enable signal CLE enables a command, transmitted as the signal DQ, to be latched in the command register 15C. The address latch enable signal ALE enables an address, transmitted as the signal DQ, to be latched in the address register 15B. The write enable signal WEn enables data, transmitted as the signal DQ, to be stored in the input/output circuit 12. The read enable signal REn enables data, read from the memory cell array 11, to be output as a signal DQ. The write protect signal WPn is asserted when a write operation and an erase operation directed to the semiconductor memory device 10 are prohibited.

The ready/busy circuit 14 generates a ready/busy signal R/Bn under the control of the sequencer 16. The ready/busy signal R/Bn indicates whether the semiconductor memory device 10 is in a ready state or in a busy state. The ready state indicates that the semiconductor memory device 10 is ready to receive an instruction from the memory controller 1. The busy state indicates that the semiconductor memory device 10 is not ready to receive an instruction from the memory controller 1. The memory controller 1 can know whether the semiconductor memory device 10 is in the ready state or in the busy state, upon receiving the ready/busy signal R/Bn from the semiconductor memory device 10.

The status register 15A stores status information STS necessary for operation of the semiconductor memory device 10. The status register 15A transfers the status information STS to the input/output circuit 12, following instruction by the sequencer 16.

The address register 15B stores an address ADD transferred from the input/output circuit 12. The address ADD includes a row address and a column address. The row address typically includes a block address that designates the block BLKm to be operated, and a page address that designates the word line WL to be operated in the designated block.

The command register 15C stores a command CMD transferred from the input/output circuit 12. The command CMD typically includes a write command that instructs the sequencer 16 to perform a write operation, a read command that instructs a read operation, and an erase command that instructs an erase operation.

A static random access memory (SRAM) is typically used for the status register 15A, the address register 15B, and the command register 15C.

The sequencer 16 receives a command from the command register 15C, and comprehensively controls the semiconductor memory device 10 according to a sequence based on the command.

The sequencer 16 controls the voltage generator 17, the row decoder 18, the column decoder 19, the data register 20, the sense amplifier 21 and so forth, to execute write operation, read operation, and erase operation. More specifically, the sequencer 16 controls the voltage generator 17, the row decoder 18, the data register 20, and the sense amplifier 21 based on the write command received from the command register 15C, and writes data in the plurality of memory cell transistors designated by the address ADD. The sequencer 16 also controls the voltage generator 17, the row decoder 18, the column decoder 19, the data register 20, and the sense amplifier 21 based on the read command received from the command register 15C, and reads data from the plurality of memory cell transistors designated by the address ADD. The sequencer 16 also controls the voltage generator 17, the row decoder 18, the column decoder 19, the data register 20, and the sense amplifier 21 based on the erase command received from the command register 15C, and erases data having been stored in the block designated by the address ADD.

The voltage generator 17 receives a power supply voltage VDD and a ground voltage VSS, from the outside of the semiconductor memory device 10 through power source terminals. The power supply voltage VDD is an external voltage supplied from the outside of the semiconductor memory device 10, and is typically 3.3 V. The ground voltage VSS is an external voltage supplied from the outside of the semiconductor memory device 10, and is typically 0 V.

The voltage generator 17 generates a plurality of levels of voltage necessary for the write operation, the read operation, and the erase operation, with use of the power supply voltage VDD. The voltage generator 17 supplies the generated voltage to the memory cell array 11, the row decoder 18, the sense amplifier 21 and so forth.

The row decoder 18 receives a row address from the address register 15B, and decodes the row address. The row decoder 18 selects one of the blocks based on the result of decoding of the row address, and further selects the word line WL in the selected block BLKm. The row decoder 18 also transfers the plurality of levels of voltage supplied from the voltage generator 17 to the selected block BLKm.

The column decoder 19 receives a column address from the address register 15B, and decodes the column address. The column decoder 19 selects a latch circuit in the data register 20, based on the result of decoding of the column address.

The data register 20 has a plurality of latch circuits. The latch circuit temporarily stores write data or read data.

The sense amplifier 21 senses and amplifies data read from the memory cell transistor to the bit line, during data read operation. The sense amplifier 21 also temporarily stores the read data DAT read from the memory cell transistor, and transfers the stored read data DAT to the data register 20. The sense amplifier 21 also temporarily stores the write data DAT transferred from the input/output circuit 12 through the data register 20, during data write operation. The sense amplifier 21 further transfers the write data DAT to the bit line.

1.1.2 Configuration of Memory Cell Array

Next, a circuit configuration of the memory cell array 11 in the semiconductor memory device 10 will be explained. As described previously, the memory cell array 11 has the plurality of blocks BLK0 to BLKm. A circuit configuration of the block BLKm will be explained below.

Figure 2:
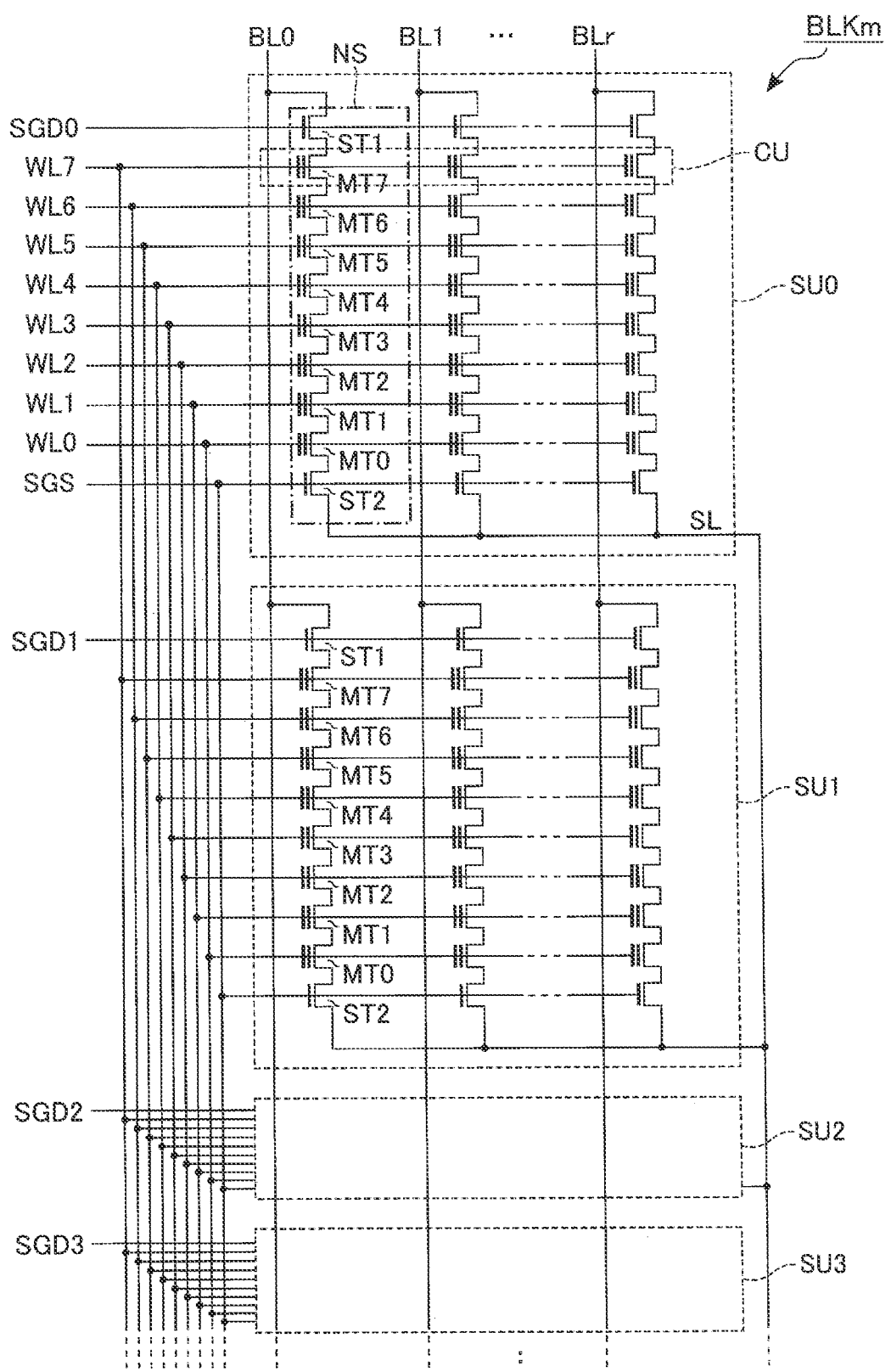
FIG. 2 is a circuit diagram of a block in a memory cell array according to the first embodiment.

FIG. 2 is a circuit diagram of the block BLKm in the memory cell array 11. The block BLKm typically has a plurality of string units SU0, SU1, SU2 and SU3. Hereinafter, notation of "string unit SU" shall indicate each of the string units SU0 to SU3. The string unit SU has a plurality of NAND strings (or memory strings) NS.

For simplicity, the explanation here will deal with a case where the NAND string NS typically has eight memory cell transistors MT0, MT1, MT2, . . . , and MT7, and two select transistors ST1 and ST2. Hereinafter, notation of "memory cell transistor MT" shall indicate each of the memory cell transistors MT0 to MT7.

The memory cell transistor MT has a control gate and a charge storage layer, and stores data in a nonvolatile manner. The memory cell transistors MT0 to MT7 are connected in series between a source of the select transistor ST1 and a drain of the select transistor ST2. The memory cell transistor MT can store 1-bit data or 2-bit or larger data.

Gates of the plurality of select transistors ST1 included in the string unit SU0 are connected to a select gate line SGD0. Similarly, gates of the select transistors ST1 of the string units SU1 to SU3 are connected to select gate lines SGD1 to SGD3, respectively. Each of the select gate lines SGD0 to SGD3 is independently controlled by the row decoder 18.

Gates of the plurality of select transistors ST2 included in the string unit SU0 are connected to a select gate line SGS. Similarly, gates of the select transistors ST2 of the individual string units SU1 to SU3 are connected to the select gate lines SGS. Note that the gates of the individual select transistors ST2 of the string units SU0 to SU3 may alternatively have independent select gate lines SGS connected thereto. The select transistors ST1 and ST2 are used to select the string units SU, in various operations.

The control gates of the memory cell transistors MT0 to MT7 included in the block BLKm are connected to the word lines WL0 to WL7, respectively. Each of the word lines WL0 to WL7 is independently controlled by the row decoder 18.

Each of the bit lines BL0 to BLr (r represents a natural number of 0 or larger) is connected to the plurality of blocks BLK0 to BLKm, and is connected to one NAND string NS in the string unit SU included in the block BLKm. That is, each of the bit lines BL0 to BLr is connected to drains of the select transistors ST1 of the plurality of NAND strings NS in the same column, from among the NAND strings NS arranged in a matrix in the block BLKm. The source line SL is connected to the plurality of blocks BLK0 to BLKm. That is, the source line SL is connected to the sources of the plurality of select transistors ST2 included in the block BLKm.

In short, the string unit SU includes the plurality of NAND strings NS connected to different bit lines BL and connected to the same select gate line SGD. The block BLKm contains the plurality of string units SU that share the word line WL. The memory cell array 11 includes the plurality of blocks BLK0 to BLKm that share the bit lines BL.

The block BLKm is typically a unit of data erasure. That is, the data stored in the memory cell transistor MT included in the block BLKm is erased by batch. Note that the data may be erased by string unit SU, or may be erased in unit smaller than the string unit SU.

A plurality of memory cell transistors MT that share the word line WL in one string unit SU is referred to as a cell unit CU. A collection of 1-bit data stored in each of the memory cell transistors MT included in the cell unit CU is referred to as a page. The cell unit CU will have the storage capacity variable according to the number of bits of data stored in the memory cell transistor MT. For example, the cell unit CU stores 1-page data when each memory cell transistor MT stores 1-bit data, stores 2-page data when 2-bit data is stored, and stores 3-page data when 3-bit data is stored.

The write operation and the read operation directed to the cell unit CU can proceed by page. In other words, the read operation and the write operation can proceed by batch, for a plurality of memory cell transistors MT connected to one word line WL provided to one string unit SU.

Note that the number of string units included in the block BLKm is freely selectable, without being limited to SU0 to SU3. Also the number of NAND strings NS included in the string unit SU, and the numbers of memory cell transistors and the select transistors included in the NAND strings NS are freely selectable. The memory cell transistor MT may be of a metal-oxide-nitride-oxide-silicon (MONOS) type that uses an insulating film as a charge storage layer, or may be of floating gate (FG) type that uses a conductive layer as a charge storage layer.

1.1.3 Configuration of Sense Amplifier

Figure 3:
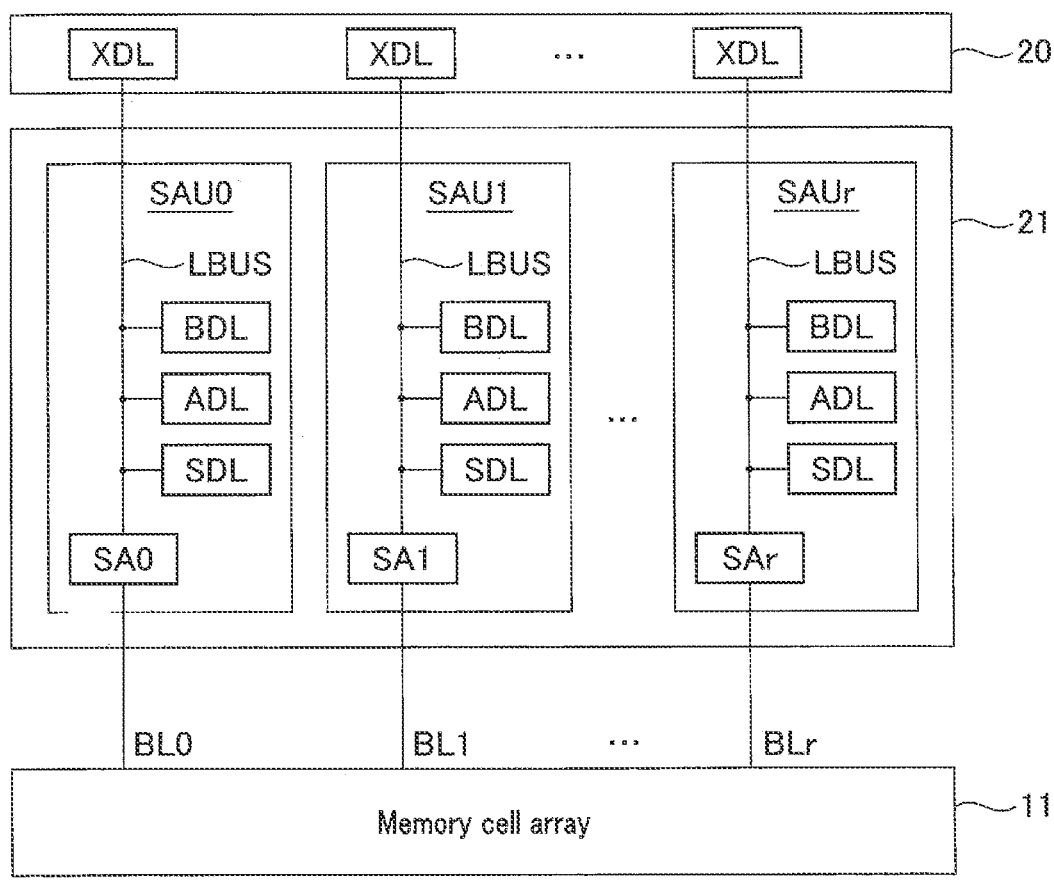
FIG. 3 is a diagram illustrating a circuit configuration of a sense amplifier according to the first embodiment.

Next, a circuit configuration of the sense amplifier 21 in the semiconductor memory device 10 will be explained. FIG. 3 is a diagram illustrating a circuit configuration of the sense amplifier 21 in the semiconductor memory device 10 according to the first embodiment. The sense amplifier 21 includes a plurality of sense amplifier units SAU0, SAU1, . . . , and SAUr (r represents a natural number of 0 or larger).

The sense amplifier units SAU0 to SAUr are associated with the bit lines BL0 to BLr, respectively. That is, the sense amplifier units SAU0 to SAUr are connected to the bit lines BL0 to BLr, respectively. The sense amplifier unit SAUr typically includes a sense amplifier unit SAr, latch circuits SDL, ADL and BDL, and a bus LBUS.

In the read operation, the sense amplifier unit SAr typically determines whether the read data is "0" or "1", referring to the voltage on the bit line BLr. In other words, the sense amplifier unit SAr senses and amplifies the voltage read on the bit line BLr, and determines the data stored in the selected memory cell transistor MT. Each of the latch circuits SDL, ADL and BDL temporarily stores read data, write data, and so forth.

Each of the sense amplifier unit SAr, and the latch circuits SDL, ADL and BDL is connected to the bus LBUS, and can mutually transmit and receive data through the LBUS.

The latch circuit XDL included in the data register 20 is connected to the input/output circuit 12 of the semiconductor memory device 10, and is used for input/output of data between the sense amplifier unit SAUr and the input/output circuit 12. The latch circuit XDL may also be used, typically as a cache memory of the semiconductor memory device 10. For example, the semiconductor memory device 10 may be set to the ready state when the latch circuit XDL is vacant, even when the latch circuits SDL, ADL and BDL are in use.

1.1.4 Cross Sectional Structure of Memory Cell Array

Figure 4:
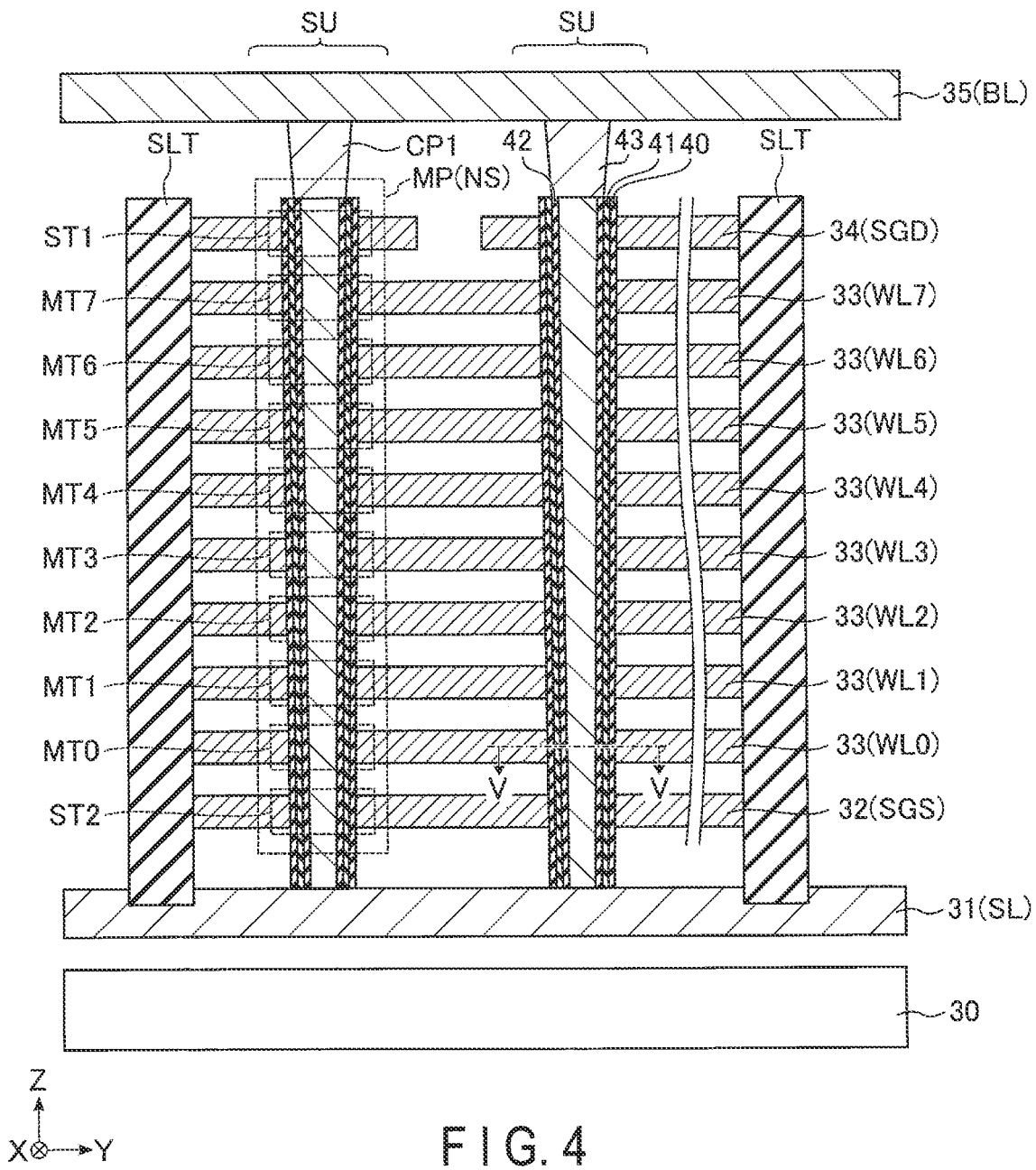
FIG. 4 is a cross sectional view illustrating a partial region of a block in the memory cell array according to the first embodiment.

Next, an exemplary cross sectional structure of the block BLKm in the memory cell array 11 will be explained. FIG. 4 is a cross sectional view illustrating a partial region of the block BLKm in the memory cell array 11. In FIG. 4, two directions parallel to the surface of a semiconductor substrate 30 and orthogonal to each other are defined as the X-direction and the Y-direction, and the direction orthogonal to the plane (XY-plane) that includes the X-direction and the Y-direction is defined as the Z-direction. The X-direction corresponds to the direction the word line WL extends, the Y-direction corresponds to the direction the bit line BL extends, and the Z-direction corresponds to the direction the word lines WL are stacked. Note that FIG. 4 does not illustrate insulating interlayers between conductive layers.

As illustrated in FIG. 4, the memory cell array 11 includes conductive layers 31 to 35, a memory pillar MP, a contact plug CP1, and a slit SLT, all provided above the semiconductor substrate 30.

The conductive layer 31 is provided above the semiconductor substrate 30. The conductive layer 31 is formed in a flat plate shape, parallel to the main plane (or, XY-plane) of the semiconductor substrate 30. The conductive layer 31 functions as a source line SL. The conductive layer 31 typically contains impurity-doped polysilicon or tungsten (W).

On the conductive layer 31, a plurality of slits SLT along the XZ-plane are arranged in the Y-direction. A structure (or, stack), which resides on the conductive layer 31 and between the adjacent slits SLT, typically corresponds a plurality of string units SU.

Over the conductive layer 31 and between the adjacent slits SLT, there are provided, sequentially from the bottom, the conductive layer 32, the conductive layers 33, and the conductive layer 34. Among these conductive layers, those adjacent in the Z-direction are stacked with an insulating interlayer interposed in between. Each of the conductive layers 32 to 34 is formed in a flat plate shape, parallel to the XY-plane. The conductive layer 32 functions as a select gate line SGS. The conductive layers 33, sequentially from the bottom, function as the word lines WL0 to WL7. The conductive layer 34 functions as a select gate line SGD. The conductive layers 32 to 34 typically contain tungsten (W) or polysilicon.

A plurality of memory pillars MP are arranged typically in a staggered manner in the X-direction and the Y-direction. Each of the memory pillars MP extends in (or penetrates) the stack between the slits SLT, in the Z-direction. Each memory pillar MP is provided from above the conductive layer 34 down to the top face of the conductive layer 31, while extended through the conductive layers 34, 33 and 32. Each memory pillar MP typically includes a block insulating layer 40, a charge storage layer 41, a tunnel insulating layer (also referred to as tunnel insulating film) 42, and a semiconductor layer 43. Each of the memory pillars MP functions as one NAND string NS.

Above the memory pillar MP, there are provided a plurality of conductive layers 35 while placing an insulating interlayer in between. The conductive layers 35 are arranged in the X-direction. Each conductive layer 35 is a line-shaped interconnect layer that extends in the Y-direction, and functions as the bit line BL. Each conductive layer 35 is electrically connected to one memory pillar MP that corresponds to every string unit SU. More specifically, in each string unit SU, a contact plug CP1 is provided on the semiconductor layer 43 of each memory pillar MP, and one conductive layer 35 is provided on the contact plug CP1. The conductive layer 35 typically contains aluminum (Al) or tungsten (W). The contact plug CP1 contains a conductive layer, which is typically formed of tungsten (W).

A plurality of the aforementioned structures are arranged in a direction (depth direction) orthogonal to the plane on which FIG. 4 can be seen, and an assemblage of such plurality of memory pillars MP (or, NAND string NS) arranged in the depth direction configures the string unit SU.

The number of the word lines WL, and the numbers of the select gate lines SGD and SGS are variable, depending on the number of the memory cell transistors MT, and the numbers of the select transistors ST1 and ST2, respectively.

Figure 5:
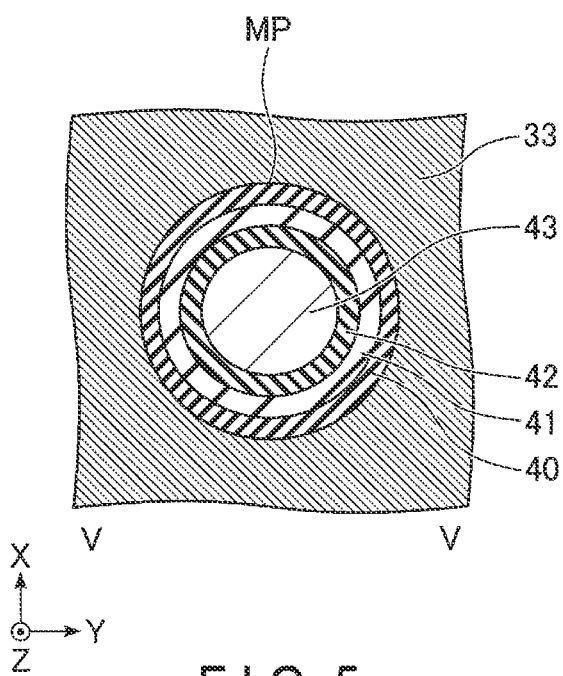
FIG. 5 is a drawing illustrating a cross sectional structure of a memory pillar in the memory cell array according to the first embodiment.

FIG. 5 is a cross-sectional view taken along line V-V in FIG. 4, which illustrates a cross-sectional structure of the memory pillar MP in the memory cell array 11. FIG. 5 illustrates an extracted cross-section of the memory pillar MP that appears in a layer, which is parallel to the surface of the semiconductor substrate 30 and includes the conductive layer 33.

As described previously, the memory pillar MP typically includes the block insulating layer 40, the charge storage layer 41, the tunnel insulating layer (also referred to as tunnel insulating film) 42, and the semiconductor layer 43. More specifically, the block insulating layer 40 is provided on the inner wall of a memory hole in which the memory pillar MP is formed. On the inner wall of the block insulating layer 40, the charge storage layer 41 is provided. The tunnel insulating layer 42 is provided on the inner wall of the charge storage layer 41. The semiconductor layer 43 is further provided inside the tunnel insulating layer 42. In other words, the semiconductor layer 43 is provided typically at the center of the memory pillar MP. The tunnel insulating layer 42 surrounds the side face of the semiconductor layer 43. The charge storage layer 41 surrounds the side face of the tunnel insulating layer 42. The block insulating layer 40 surrounds the side face of the charge storage layer 41. The conductive layer 33 surrounds the side face of the block insulating layer 40. Note that the memory pillar MP may alternatively be configured to have a core insulating layer inside the semiconductor layer 43.

In the aforementioned structure of the memory pillar MP, a part where the memory pillar MP intersects the conductive layer 32 functions as the select transistor ST2. Parts where the memory pillars MP intersect the conductive layers 33 individually function as memory cell transistors MT0 to MT7. A part where the memory pillar MP intersects the conductive layer 34 functions as the select transistor ST1.

The semiconductor layer 43 functions as a channel layer of the memory cell transistors MT0 to MT7 and the select transistors ST1 and ST2. A current path of the NAND string NS is formed inside the semiconductor layer 43.

The tunnel insulating layer 42 functions as a potential barrier, when electric charge is injected from the semiconductor layer 43 into the charge storage layer 41, or when electric charge having been stored in the charge storage layer 41 diffuses into the semiconductor layer 43. The tunnel insulating layer 42 typically contains a silicon oxide film.

The charge storage layer 41 functions to store electric charge injected from the semiconductor layer 43 in the memory cell transistors MT0 to MT7. The charge storage layer 41 is typically an insulating layer, and contains a silicon nitride film.

The block insulating layer 40 prevents the electric charge stored in the charge storage layer 41 from diffusing into the conductive layers 33 (word lines WL). The block insulating layer 40 typically contains an aluminum oxide layer, a silicon oxide layer, and a silicon nitride layer.

1.1.5 Threshold Voltage Distribution in Memory Cell Transistor

Next, a relationship between data and possible threshold voltage distribution for the memory cell transistor MT will be explained.

Figure 6:
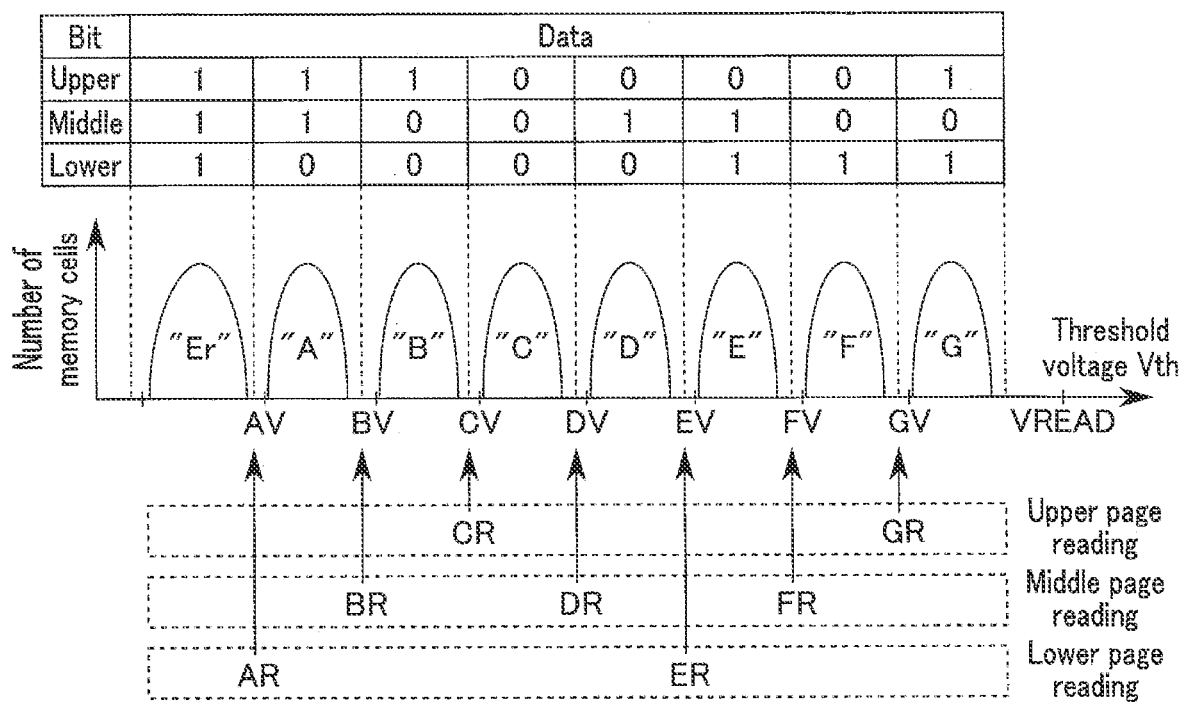
FIG. 6 is a diagram illustrating a relationship between possible threshold voltage distributions of a memory cell transistor and data, according to the first embodiment.

FIG. 6 is a diagram illustrating a relationship between data and threshold voltage distributions that may be observed in the memory cell transistors MT. The description here deals with an exemplary case where a triple-level cell (TLC) method, capable of storing 3-bit data in one memory cell transistor MT, is applied as a storage method of the memory cell transistors MT. Note that this embodiment is also applicable to the cases based on other storage methods, such as a single-level cell (SLC) method capable of storing 1-bit data in one memory cell transistor MT, a multi-level cell (MLC) method capable of storing 2-bit data in one memory cell transistor MT, and a quad-level cell (QLC) method capable of storing 4-bit data in one memory cell transistor MT.

The 3-bit data that can be stored in the memory cell transistor MT is specified by a lower bit, a middle bit, and an upper bit. When the memory cell transistor MT stores three bits, the memory cell transistor MT can take any one of eight states depending on a plurality of threshold voltage levels. The eight states are referred to as states "Er", "A", "B", "C", "D", "E", "F" and "G", in ascending order. The memory cell transistors MT that belong each of the states "Er", "A", "B", "C", "D", "E", "F" and "G" form a threshold voltage distribution as illustrated in FIG. 6.

The states "Er", "A", "B", "C", "D", "E", "F" and "G" typically has data "111", "110", "100", "000", "010", "011", "001" and "101", respectively allocated thereto. With the lower bit "X", the middle bit "Y", and the upper bit "Z", the sequence of bits is given by "Z, Y, X". Note that the threshold voltage distribution and the data allocation are freely selectable.

In order to read data stored in a read-targeted memory cell transistor MT, the state to which the threshold voltage of the memory cell transistor MT belongs is determined. To determine the state, read voltages AR, BR, CR, DR, ER, FR and GR are used. Hereinafter, a voltage that is applied to a read-targeted memory cell transistor MT for determining the level, including the read voltages AR, BR, CR, DR, ER, FR and GR, may be referred to as a read voltage VCGRV.

The state "Er" typically corresponds to a state where data has been erased (hereinafter also referred to as an erase state). The threshold voltage of the memory cell transistor MT that belongs to the state "Er" is lower than the voltage AR, and typically has a negative value.

The states "A" to "G" correspond to the states of the memory cell transistors MT having the data written therein, as a result of injection of electric charge into the charge storage layer, where the threshold voltage levels of the memory cell transistors MT that belong to the states "A" to "G" typically have positive values. The threshold voltage of the memory cell transistor MT that belongs to the state "A" is higher than the read voltage AR, and equal to or lower than the read voltage BR. The threshold voltage of the memory cell transistor MT that belongs to the state "B" is higher than the read voltage BR, and equal to or lower than the read voltage CR. The threshold voltage of the memory cell transistor MT that belongs to the state "C" is higher than the read voltage CR, and equal to or lower than the read voltage DR. The threshold voltage of the memory cell transistor MT that belongs to the state "D" is higher than the read voltage DR, and equal to or lower than the read voltage ER. The threshold voltage of the memory cell transistor MT that belongs to the state "E" is higher than the read voltage ER, and equal to or lower than the read voltage FR. The threshold voltage of the memory cell transistor MT that belongs to the state "F" is higher than the read voltage FR, and equal to or lower than the read voltage GR. The threshold voltage of the memory cell transistor MT that belongs to the state "G" is higher than the read voltage GR, and lower than the read voltage VREAD.

The voltage VREAD is a voltage applied to the word lines WL connected to the memory cell transistors MT in the cell unit CU, which is not a read target, and is higher than the threshold voltages of the memory cell transistors MT in any state. Hence, the memory cell transistor MT to which the voltage VREAD is applied to the control gate is turned on regardless of data stored therein.

Between every adjacent threshold distributions, there are set verify voltage used in the write operation. More specifically, verify voltages AV, BV, CV, DV, EV, FV and GV are set corresponding to the states "A", "B", "C", "D", "E", "F" and "G", respectively. For example, the verify voltages AV, BV, CV, DV, EV, FV and GV are set slightly higher than the read voltages AR, BR, CR, DR, ER, FR and GR, respectively.

As explained above, each of the memory cell transistors MT is set any of the eight states, and can store 3-bit data. Writing and reading are performed on a page-by-page basis in a single cell unit CU. In the case where 3-bit data is stored in each memory cell transistor MT, a lower bit, a middle bit, and an upper bit are respectively allocated to three pages in a single cell unit CU. With respect to the lower bit, the middle bit, and the upper bit, a page that is written by one write operation or a page that is read by one read operation, that is, a set including lower bits, a set including middle bits, and a set including upper bits stored in a cell unit CU, are respectively referred to as a lower page, a middle page, and an upper page.

When the data allocation described above is applied, the lower page is determined by the read operation with use of the read voltages AR and ER. The middle page is determined by the read operation with use of the read voltages BR, DR and FR. The upper page is determined by the read operation with use of the read voltages CR and GR.

1.2 Operation of First Embodiment

Erase operation in the semiconductor memory device 10 of the first embodiment will be explained. The erase operation is an operation of setting a memory cell to the erase state. In other words, the erase operation is an operation of extracting or annihilating electrons having been stored in the charge storage layer of the memory cell transistor MT, and causing transition of the threshold voltage of the memory cell transistor MT within the threshold voltage distribution of the state Er.

1.2.1 Outline of Erase Operation

Figure 7:
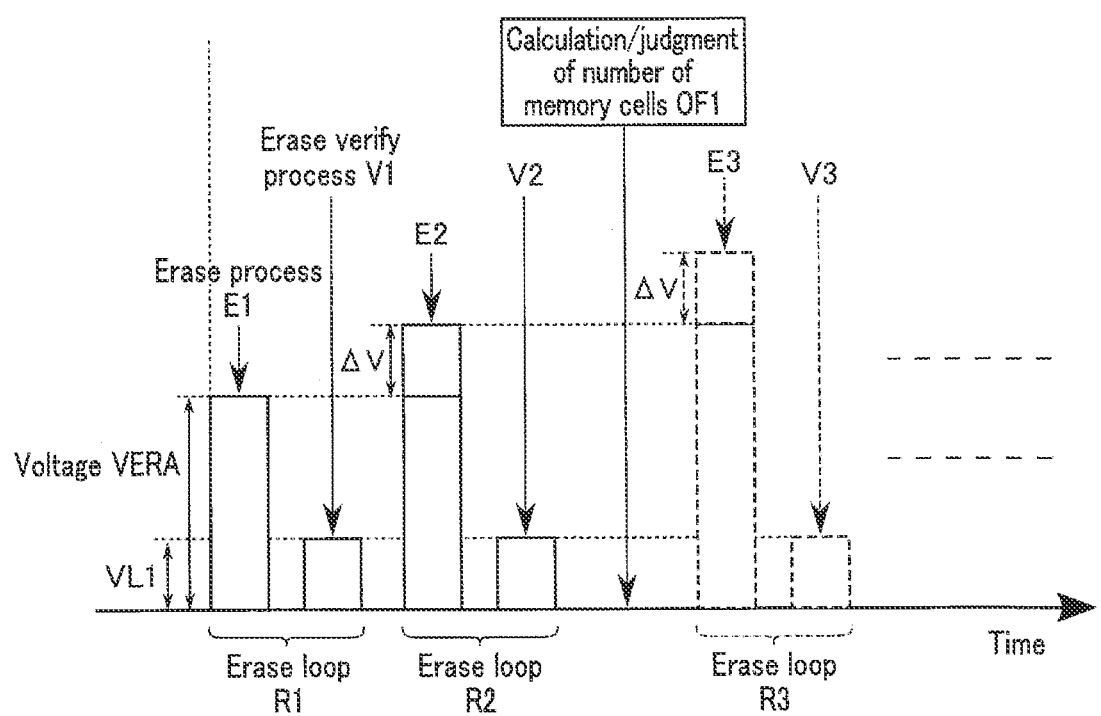
FIG. 7 is a diagram illustrating an outline of erase operation of the semiconductor memory device of the first embodiment.

An outline of Erase operation in the semiconductor memory device 10 of the first embodiment will be explained. FIG. 7 is a diagram illustrating the outline of the erase operation of the semiconductor memory device 10. Note that the description below will deal with an exemplary case where the erase operation in the semiconductor memory device 10 takes place by block BLK, although the operation can take place either by block or by a unit smaller than the block (by string unit SU, for example), as described previously.

As illustrated in FIG. 7, the erase operation of the first embodiment includes an erase process, an erase verify process, and "calculation/judgement of number of memory cells OF1".

The erase process relates to an operation of erasing data stored in the memory cell transistors MT in an erase target block. In other words, the erase process relates to an operation of applying an erase voltage VERA to the memory cell transistors MT in the erase target block, and erasing data having been stored in the memory cell transistors MT. In more detail, the erase process relates to an operation of supplying the erase voltage VERA to a source line CELSRC, to extract electrons from the charge storage layer of the memory cell transistors MT in the erase target block. The erase process alternatively relates to an operation of supplying the erase voltage VERA to the source line CELSRC, to inject holes into the charge storage layer of the memory cell transistors MT in the erase target block, and to annihilate the electrons.

The erase verify process relates to an operation of verifying the data erasure by the erase process, from the memory cell transistors MT. In other words, the erase verify process relates to a read operation of confirming whether or not the threshold voltage of the memory cell transistors MT has transitioned into the threshold voltage distribution in the erase state. In more detail, the erase verify process relates to an operation of supplying the verify voltage to the word lines WL, and determining whether or not the threshold voltages of the memory cell transistors MT are lower than the verify voltage.

In the erase operation, the erase process and the subsequent erase verify process form one erase loop. FIG. 7 illustrates a first erasure loop R1, a second erasure loop R2, and a third erasure loop R3. The erase loop R1 includes an erase process E1 and an erase verify process V1. The erase loop R2 includes an erase process E2 and an erase verify process V2. The erase loop R3 includes an erase process E3 and an erase verify process V3.

In the first embodiment, calculation/judgement of the number of memory cells OF1 takes place after execution of the erase loop R2. The calculation/judgement of the number of memory cells OF1 is an operation of confirming erase characteristic of the memory cell transistors MT resulted from the erase process. More specifically, the operation is to verify the number of memory cell transistors that have returned to failure in the erase verify process V2, from among the memory cell transistors that have passed the erase verify process V1. Depending on result of the calculation/judgment of the number of memory cells OF1, an erase verification is judged to be failed, or the erase loop R3 takes place.

In the verification by each of the erase verify processes V1 to V3, the sequencer 16 judges that the memory cell transistors MT passed the erase verification, if the number of the memory cell transistors MT, having a threshold voltage higher than a certain voltage level (referred to as verify level or verify voltage, hereinafter) VL1, is smaller than a predetermined number. On the other hand, the sequencer 16 judges that the erase verification has failed, when the number of memory cell transistors MT, having a threshold voltage higher than the verify level VL1, is equal to or larger than the predetermined number. Upon failure of the erase verification, the sequencer 16 repeats the erase loop, and ends the erase operation upon pass of the erase verification. The erase operation that includes the erase loops R1 to R3, and the calculation/judgement of the number of memory cells OF1 will be detailed later.

Figure 8:
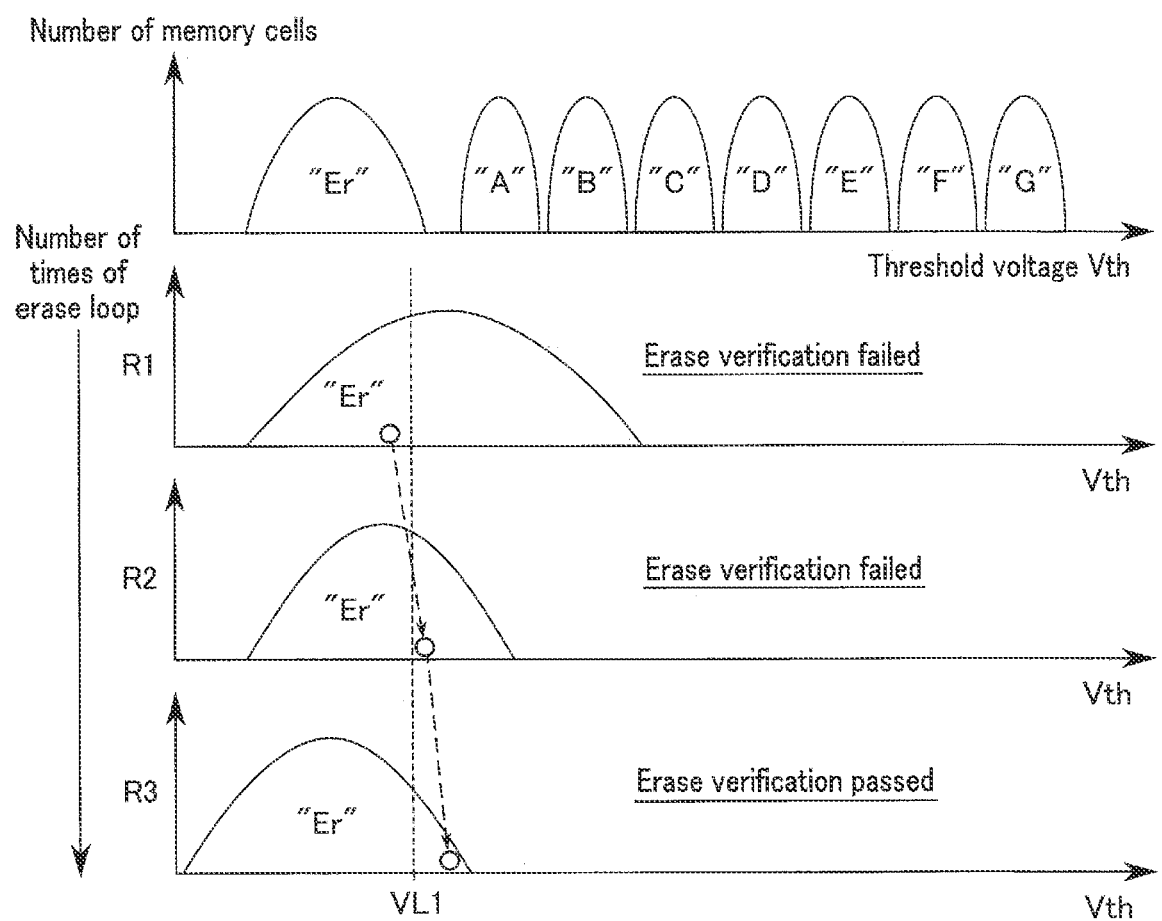
FIG. 8 is a diagram illustrating transition of the threshold voltage distribution of the memory cell transistor, as a result of the erase operation according to the first embodiment.

FIG. 8 is a diagram illustrating threshold voltage distribution of the memory cell transistors MT, when the erase operation takes place on the memory cell transistors MT in the block having data stored therein.

The number of the memory cell transistors MT, having a threshold voltage higher than the verify level VL1, will not sharply fall below a predetermined number in the first erase loop R1, but will instead fall below the predetermined number after going through a two or more number of erase loops including the erase loops R2 and R3. For example, when the erase verification failed in the first erase loop R1, the second erase loop R2 will take place. When the erase verification failed in the second erase loop R2, the third erase loop R3 will take place. As illustrated in FIG. 7, the level of the erase voltage VERA in the erase process in the repetitive erase loops is incremented by AV.

Now, focus is placed on the memory cell transistors MT that have passed the erase verification in the first erase loop R1. The second erase loop R2, when directed to the memory cell transistors MT that have passed the erase verification, would sometimes make some memory cell transistor MT fail in the erase verification. That is, some of the memory cell transistors MT that have passed the first erase verify process V1 would return to failure in the second erase verify process V2.

In this case, even when the number of memory cell transistors MT that have once passed the erase verification and then failed increased in the third erase loop R3, the block would pass the erase verification, when the number of memory cell transistors MT having a threshold voltage higher than the verify level VL1 becomes smaller than a predetermined number. Now, when writing and erasing are performed to such block in which the number of memory cell transistors MT that have once passed through the erase verification and then failed in the subsequent erase verification exceeds a certain number, the memory cell transistors MT would unfortunately degrade the characteristics.

Hence, the first embodiment is devised to determine the number of memory cell transistors MT that have once passed the erase verification, and then failed in the subsequent erase verification. Such number of memory cell transistors MT that have once passed the erase verification and then failed in the subsequent erase verification is the aforementioned number of memory cells OF1. When the number of memory cells OF1 exceeds a criterion, the block will be judged to be a bad block, and will be made unusable.

1.2.2 Details of Erase Operation

Figure 9:
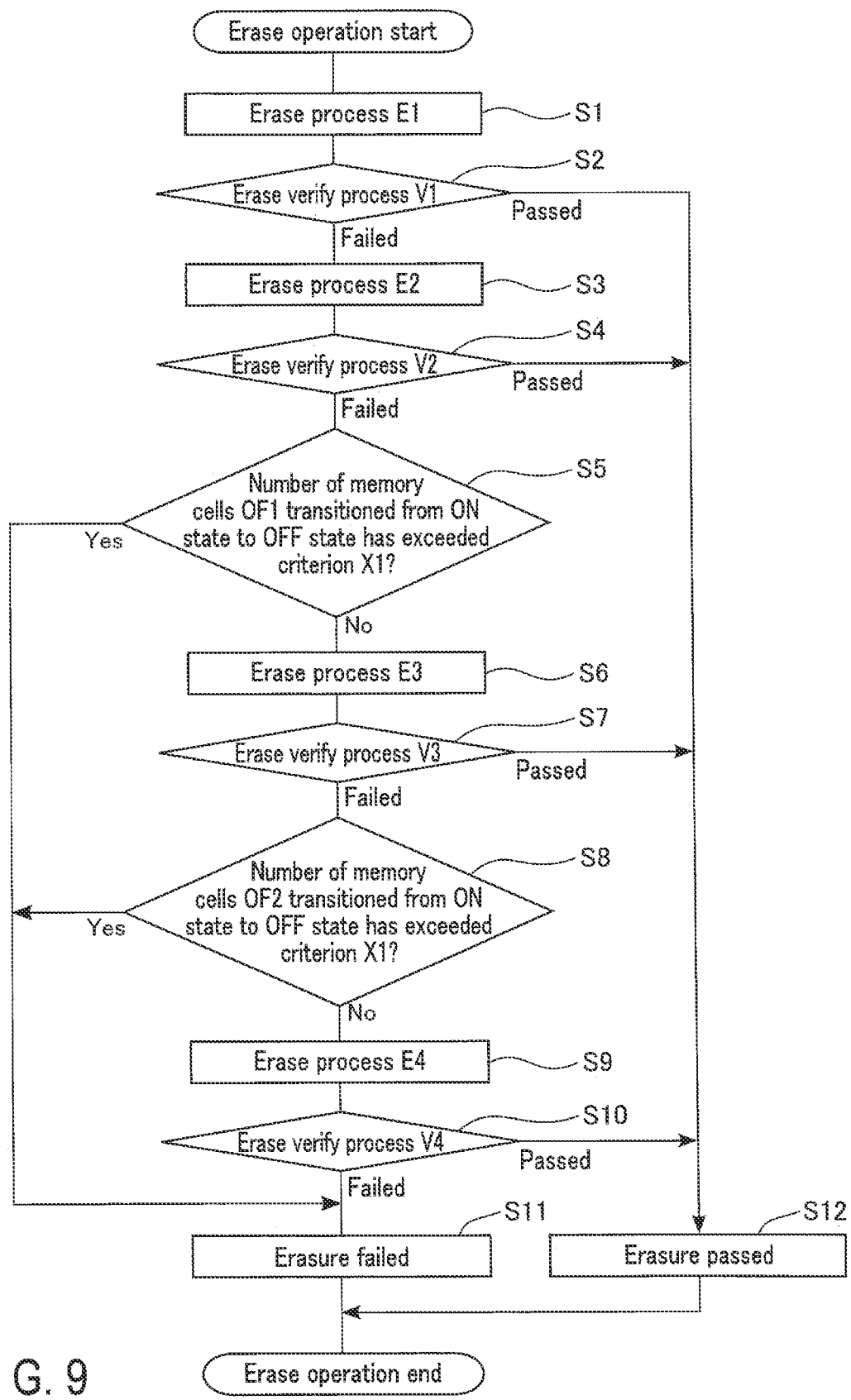
FIG. 9 is a flow chart illustrating the erase operation of the semiconductor memory device of the first embodiment.

Erase operation in the semiconductor memory device 10 of the first embodiment will be explained below. FIG. 9 is a flow chart illustrating an erase operation in the semiconductor memory device 10. This operation is controlled by the sequencer 16.

Upon start of the erase operation, the sequencer 16 executes the erase process E1 on an erase target block BLK, with use of the erase voltage VERA (S1). More specifically, the erase voltage VERA is applied (or supplied) to the source line CELSRC, to erase the data having been stored in the memory cell transistors MT in the block BLK. That is, the erase voltage VERA is applied (or supplied) to the source line CELSRC, to cause transition of the threshold voltage of the memory cell transistors MT in the block ELK towards the state Er. The voltage waveforms of the source line CELSRC, the word line WL, the select gate lines SGD and SGS, and the bit line BL in the erase process E1 will be described later.

Next, the sequencer 16 executes the erase verify process V1 on the erase target block BLK, by using the verify level VL1 (S2). That is, the sequencer 16 executes the read operation for determining the erase state of the memory cell transistors MT after the execution of the erase process E1, while using the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF. In the above description referring to FIGS. 7 and 8, the memory cell transistor MT in the ON state is denoted as "passed", and that in the OFF state is denoted as "failed".

The sequencer 16 acquires the number of memory cell transistors MT in the OFF state, by the read operation with use of the verify level VL1 in the erase verify process V1. The number of memory cell transistors MT in the OFF state in the erase verify process V1 will be referred to as off-bit number F1, hereinafter. As a result of such read operation, the sequencer 16 further acquires information of the memory cell transistor MT in the ON state. The information on the memory cell transistor MT in the ON state may be acquired, typically by storing data read from the memory cell transistor MT in a first latch circuit of the sense amplifier unit SAUr.

The sequencer 16 determines whether the off-bit number F1 obtained in the read operation has exceeded a predetermined value, or not (S2). When the off-bit number F1 has exceeded the predetermined value (failed), the sequencer 16 judges that the erase target block after execution of the erase process E1 has failed in the erase verification, and advances to step S3. On the other hand, when the off-bit number F1 has not exceeded the predetermined value (passed), the sequencer 16 judges that the erase target block has passed the erase verification, and advances to step S12. The erase target block is then managed as a usable erased block (S12). The voltage waveforms of the source line CELSRC, the word line WL, the select gate lines SGD and SGS, and the bit line BL in the erase verify process V1 will be described later.

Next, when failure in the erase verify process V1 was judged, the sequencer 16 executes the erase process E2 on the erase target block BLK, with use of erase voltage "VERA+ΔV" (S3). More specifically, the erase voltage "VERA+ΔV" is applied to the source line CELSRC, to cause further transition of the threshold voltage of the memory cell transistors MT in the block BLK towards the state Er.

Next, the sequencer 16 executes the erase verify process V2 on the erase target block BLK, by using the verify level VL1 (S4). That is, the sequencer 16 executes the read operation for judging the erase state of the memory cell transistors MT after the execution of the erase process E2, with use of the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the number of memory cell transistors MT in the OFF state, by the read operation with use of the verify level VL1 in the erase verify process V2. The number of memory cell transistors MT in the OFF state in the erase verify process V2 will be referred to as off-bit number F2, hereinafter. As a result of such read operation, the sequencer 16 further acquires information of the memory cell transistor MT in the ON state. The information on the memory cell transistor MT in the ON state may be acquired, typically by storing data read from the memory cell transistor MT in a second latch circuit of the sense amplifier unit SAUr.

The sequencer 16 determines whether the off-bit number F2 obtained in the read operation has exceeded a predetermined value, or not. When the off-bit number F2 has exceeded the predetermined value (failed), the sequencer 16 judges that the erase target block after execution of the erase process E2 has failed in the erase verification, and advances to step S5. On the other hand, when the off-bit number F2 has not exceeded the predetermined value (passed), the sequencer 16 judges that the erase target block has passed the erase verification, and advances to step S12. The erase target block is then managed as a usable erased block (S12).

Next, when failure in the erase verify process V2 was judged, the sequencer 16 judges whether the number of memory cells OF1 of the memory cell transistors MT, having transitioned from the ON state in the erase verify process V1 to the OFF state in the erase verify process V2, exceeds a criterion X1, or not (S5). That is, the sequencer 16 judges whether the number of the memory cells OF1 of the memory cell transistor MT, once in the ON state in the erase verify process V1 and then turned into the OFF state in the erase verify process V2, exceeds the criterion X1, or not. More specifically, the sequencer 16 compares information of the memory cell transistors MT in the ON state acquired in the erase verify process V1, with information of the memory cell transistors MT in the OFF state acquired in the erase verify process V2, and calculates the number of memory cells OF1 of the memory cell transistors MT having transitioned from the ON state to the OFF state. The sequencer 16 then judges whether the number of memory cells OF1 exceeds the criterion X1 or not.

Next, when the number of memory cells OF1 has exceeded the criterion X1 (Yes) in step S5, the sequencer 16 judges that the erase target block after execution of the erase process E2 has failed in the erase verification, and advances to step S11. The erase target block is then managed as an unusable bad block (S11). With the judgment in step S5, the sequencer 16 can rapidly recognize degradation of the erase characteristic of the memory cell transistor MT in the erase target block, and can stop execution of the subsequent erase loop on the erase target block.

On the other hand, when the number of memory cells OF1 has not exceeded the criterion X1 (No) in step S5, the sequencer 16 executes the erase process E3 on the erase target block BLK, with use of erase voltage "VERA+2ΔV" (S6). More specifically, the erase voltage "VERA+2ΔV" is applied to the source line CELSRC, to cause further transition of the threshold voltage of the memory cell transistors MT in the block BLK towards the state Er.

Next, the sequencer 16 executes the erase verify process V3 on the erase target block BLK, by using the verify level VL1 (S7). That is, the sequencer 16 executes the read operation for judging the erase state of the memory cell transistors MT after the execution of the erase process E3, with use of the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the number of memory cell transistors MT in the OFF state, by the read operation with use of the verify level VL1 in the erase verify process V3. The number of memory cell transistors MT in the OFF state in the erase verify process V3 will be referred to as off-bit number F3, hereinafter. As a result of such read operation, the sequencer 16 further acquires information of the memory cell transistor MT in the ON state. The information on the memory cell transistor MT in the ON state may be acquired, typically by storing data read from the memory cell transistor MT in a third latch circuit of the sense amplifier unit SAUr.

The sequencer 16 judges whether the off-bit number F3 obtained in the read operation has exceeded a predetermined value, or not. When the off-bit number F3 has exceeded the predetermined value (failed), the sequencer 16 judges that the erase target block after execution of the erase process E3 has failed in the erase verification, and advances to step S8. On the other hand, when the off-bit number F3 has not exceeded the predetermined value (passed), the sequencer 16 judges that the erase target block has passed the erase verification, and advances to step S12. The erase target block is then managed as a usable erased block (S12).

Next, when failure in the erase verify process V3 was judged, the sequencer 16 judges whether the number of memory cells OF2 of the memory cell transistors MT, having transitioned from the ON state in the erase verify process V2 to the OFF state in the erase verify process V3, exceeds the criterion X1, or not (S8). That is, the sequencer 16 judges whether the number of the memory cells OF2 of the memory cell transistors MT, once in the ON state in the erase verify process V2 and then turned into the OFF state in the erase verify process V3, exceeds the criterion X1, or not. More specifically, the sequencer 16 compares information of the memory cell transistor MT in the ON state acquired in the erase verify process V2, with information of the memory cell transistor MT in the OFF state acquired in the erase verify process V3, and calculates the number of memory cells OF2 of the memory cell transistors MT having transitioned from the ON state to the OFF state. The sequencer 16 then judges whether the number of memory cells OF2 exceeds the criterion X1 or not.

Next, when the number of memory cells OF2 has exceeded the criterion X1 (Yes) in step S8, the sequencer 16 judges that the erase target block after execution of the erase process E3 has failed in the erase verification, and advances to step S11. The erase target block is then managed as an unusable bad block (S11). With the judgment in step S8, the sequencer 16 can rapidly recognize degradation of the erase characteristic of the memory cell transistors MT in the erase target block, and can stop execution of the subsequent erase loop on the erase target block.

On the other hand, when the number of memory cells OF2 has not exceeded the criterion X1 (No) in step S8, the sequencer 16 executes the erase process E4 on the erase target block BLK, with use of erase voltage "VERA+3ΔV" (S9). More specifically, the erase voltage "VERA+3ΔV" is applied to the source line CELSRC, to cause further transition of the threshold voltage of the memory cell transistors MT in the block BLK towards the state Er.

Next, the sequencer 16 executes the erase verify process V4 on the erase target block BLK, by using the verify level VL1 (S10). That is, the sequencer 16 executes the read operation for judging the erase state of the memory cell transistors MT after the execution of the erase process E4, with use of the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the number of memory cell transistors MT in the OFF state, by the read operation with use of the verify level VL1 in the erase verify process V4. The number of memory cell transistors MT in the OFF state in the erase verify process V4 will be referred to as off-bit number F4, hereinafter.

The sequencer 16 judges whether the off-bit number F4 obtained in the read operation has exceeded a predetermined value, or not. When the off-bit number F4 has exceeded the predetermined value (failed), the sequencer 16 judges that the erase target block after execution of the erase process E4 has failed in the erase verification, and advances to step S11. The erase target block is then managed as an unusable bad block (S11). On the other hand, when the off-bit number F4 has not exceeded the predetermined value (passed), the sequencer 16 judges that the erase target block has passed the erase verification, and advances to step S12. The erase target block is then managed as a usable erased block (S12). The erase operation thus comes to the end.

The aforementioned erase operation exemplifies a case where the maximum number of times of erase loop is set to four. For a case where the maximum number of times of erase loop is set to a number larger than four, the erase loop will further be repeated until the erase verification is passed, or until the maximum number of times of the erase loop is reached.

In the read operation in the erase verify process, the ON state or the OFF state of each of the memory cell transistors MT may alternatively be judged by block BLK, or by string unit SU.

The ON state or the OFF state of each of the memory cell transistors MT may alternatively be judged by one word line or by a plurality of word lines of the block (or string unit). The ON states or the OFF states of the memory cell transistors MT included in the NAND string NS may be judged by measuring the resistivity for every NAND string NS (or, memory pillar MP). For example, the word lines of the block (or string unit) may be divided, and the ON states or the OFF states of the memory cell transistors MT may be judged by thus divided word lines. More specifically, the word lines of the block (or string unit) may be divided into even-numbered word lines and odd-numbered word lines when viewed in the direction of stacking of the word lines, and the ON state or the OFF state of each of the memory cell transistors MT may be judged alternatively for those connected to the even-numbered word line and for those connected to the odd-numbered word line.

1.2.3 Voltage Waveform of Erase Operation

Figure 10:
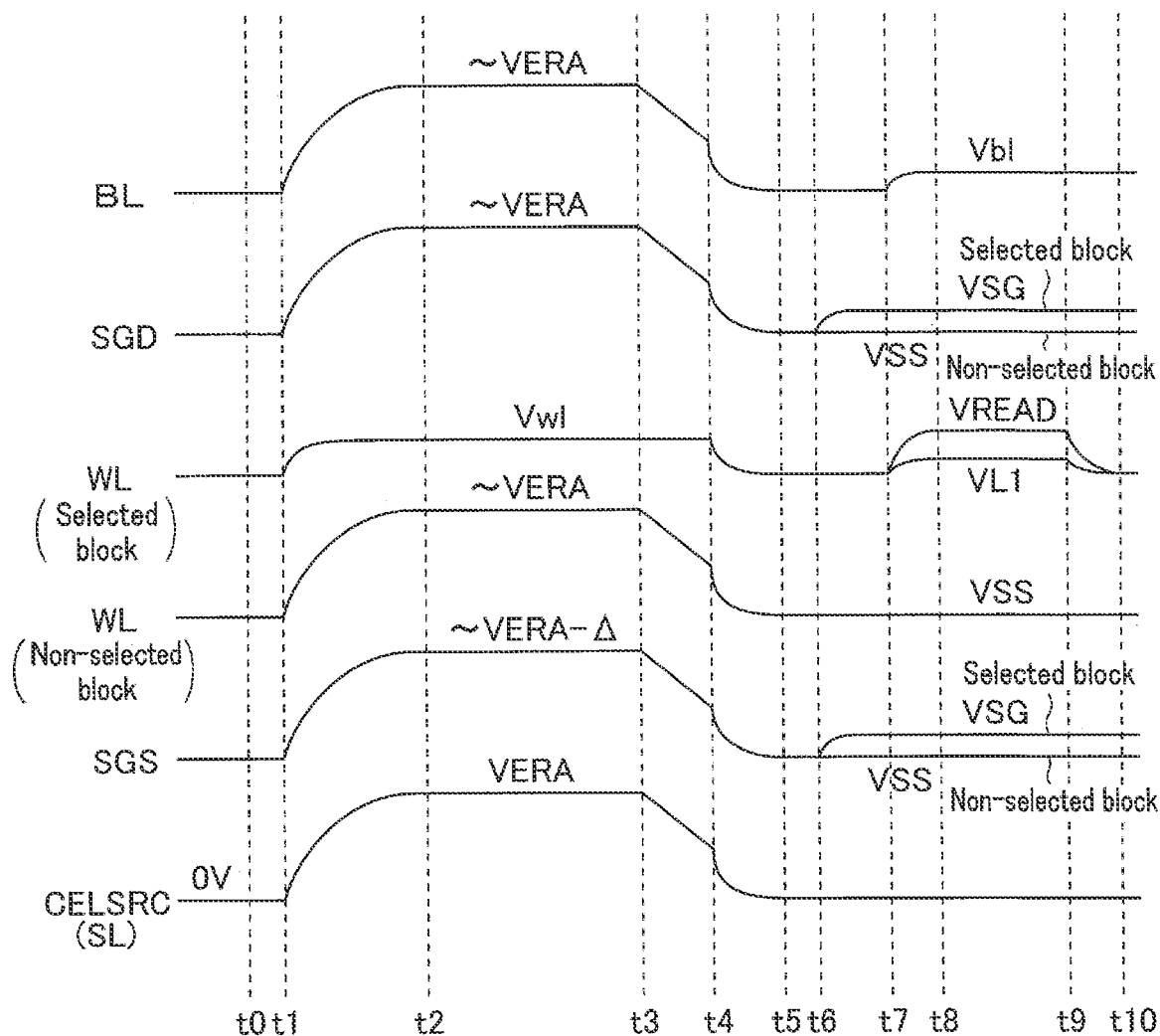
FIG. 10 is a diagram illustrating voltage waveforms of signals in the erase operation of the first embodiment.

The paragraphs below will explain voltage waveforms of the source line CELSRC, the word line WL, the select gate lines SGD and SGS, and the bit line BL, in the erase operation that includes the erase process and the erase verify process. FIG. 10 is a diagram illustrating voltage waveforms of the individual signals in the erase process and the erase verify process. The explanation herein will be made on the erase process E1 and the erase verify process V1.

Execution of the erase process E1 precedes in the time t0 to t5, and execution of the erase verify process V1 succeeds in the time t5 to t10. A series of processes in the time t0 to t10 corresponds to one erase loop.

The erase process E1 will be explained below. At time t0, the bit line BL, the select gate lines SGD and SGS, the word line WL, and the source line CELSRC are set to voltage VSS (0 V, for example).

Next, in the time t1 to t3, for example, the erase voltage VERA is applied to the source line CELSRC. In response, the channel regions of the memory cell transistors MT are boosted to the erase voltage VERA, in the time t1 to t3. The voltage VERA applied to the source line CELSRC further causes capacitive coupling, to boost the bit line BL, the select gate lines SGD and SGS, and the word line WL of the block of an erase non-target (or, non-selected block) up to the voltage VERA. Note that the select gate line SGS is boosted up to a voltage lower by voltage $\Delta$ than the voltage VERA.

Further in the time t1 to t3, the row decoder 18 applies a voltage Vw1 lower than the erase voltage VERA, to the word lines WL of the erase target block (or, selected block). This accordingly produces potential difference between the erase voltage VERA in the channel regions of the memory cell transistors MT and the voltage Vw1 of the word lines WL of the erase target block, causing extraction of electrons from the charge storage layer of the memory cell transistors MT in the erase target block, into the channel layer. Alternatively, holes are injected into the charge storage layer of the memory cell transistors MT, to annihilate the electrons. That is, the data of the memory cell transistors MT in the erase target block is erased.

Thereafter in the time t3 to t5, the bit line BL, the select gate lines SGD and SGS, the word lines WL, and the source line CELSRC are set to voltage VSS. The erase process E1 thus comes to the end.

Next, the erase verify process V1 in the time t5 to t10 will be described.

At time t6, the row decoder 18 applies the voltage VSG to the select gate lines SGD and SGS of the selected block. The voltage VSG turns on the select transistors ST1 and ST2.

Next, in the time t7 to t9, the row decoder 18 applies the verify level VL1 to the word line WL to be judged of the erase target block. The row decoder 18 also applies the voltage VREAD to the word line WL not to be judged. The verify level VL1 is a read voltage used for judging the erase state of the memory cell transistors MT in the erase target block. The voltage VREAD is a voltage that turns on the memory cell transistors MT, regardless of the erase state of the memory cell transistors MT.

This makes the sense amplifiers 21 sense and amplify the data read onto the bit lines BL. In accordance with the read result, the sequencer 16 judges whether the memory cell transistors MT have passed or failed in the erase verification, as described previously.

Voltage waveforms in the other erase processes E2 to E4 are similar to those in the erase process E1, except that the erase voltage VERA is sequentially incremented by $\Delta V$. That is, the erase voltage is set to "VERA+$\Delta V$" in the erase process E2, and set to "VERA+2$\Delta V$" in the erase process E3. Further, the erase voltage is set to "VERA+3$\Delta V$" in the erase process E4. The voltage waveforms in the erase verify processes V2 to V4 are similar to those in the erase verify process V1.

Figure 11:
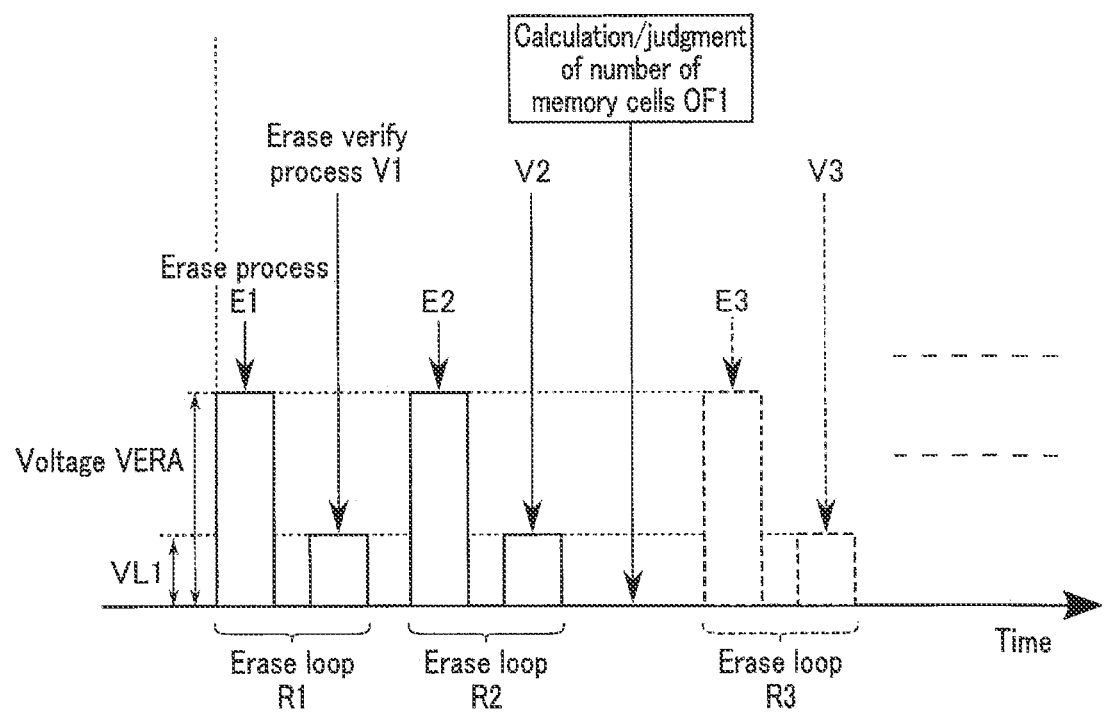
FIG. 11 is a diagram illustrating an outline of other erase operation of the semiconductor memory device of the first embodiment.

Having described in the embodiment above that the erase voltage VERA in the erase processes E1 to E4 increments by $\Delta V$, the present invention is not limited thereto. There may also be a case as illustrated in FIG. 11, where the erase voltage VERA in the erase processes E1 to E4 is set constant.

1.3 Effect of First Embodiment

The first embodiment can provide a semiconductor memory device capable of enhancing performance of the erase operation.

The effect of the first embodiment will be explained below.

The first embodiment calculates the number of memory cells OF1 (or OF2) of the memory cell transistors MT in the erase target block, having been turned ON by the first erase verification, and then turned OFF by the second erase verification subsequent to the first erase verification. In other words, the first embodiment calculates the number of memory cells OF1 of the memory cell transistors MT in the erase target block, having passed the first erase verification, and then failed in the subsequent second erase verification. The sequencer 16 then judges whether the number of memory cells OF1 has exceeded the criterion X1 or not. When the number of memory cells OF1 has exceeded the criterion X1, the erase target block may be judged to be degraded, and may be handled as a bad block.

This advantageously suppresses execution of subsequent erase loop on the erase target block, reducing unnecessary consumption of the resource. Moreover, since the erase target block will be subjected to the subsequent write operation and erase operation, after passing the erase verification, so that the memory cell transistors MT in such block may be prevented from degrading the characteristic.

As described above, the semiconductor memory device of the first embodiment can enhance performance of the erase operation.

2. Second Embodiment

A semiconductor memory device of a second embodiment will be explained. In the aforementioned first embodiment, the erase target block was judged to be a bad block, when the number of memory cells transitioned from the ON state to the OFF state in the erase verify process has exceeded the criterion. The second embodiment will not leave such erase target block as the bad block, and will instead make the block usable, when the block is verified by a relaxed erase verify process, and passed the verification. The second embodiment will be explained, mainly focusing the points different from the first embodiment.

2.1 Configuration of Second Embodiment

The block configuration of the semiconductor memory device 10, the structure of the memory cell array 11, and the configuration of the sense amplifier 21 of the second embodiment are similar to those in the first embodiment.

2.2 Operation of Second Embodiment

Erase operation in the semiconductor memory device 10 of the second embodiment will be explained.

2.2.1 Outline of Erase Operation

Figure 12:
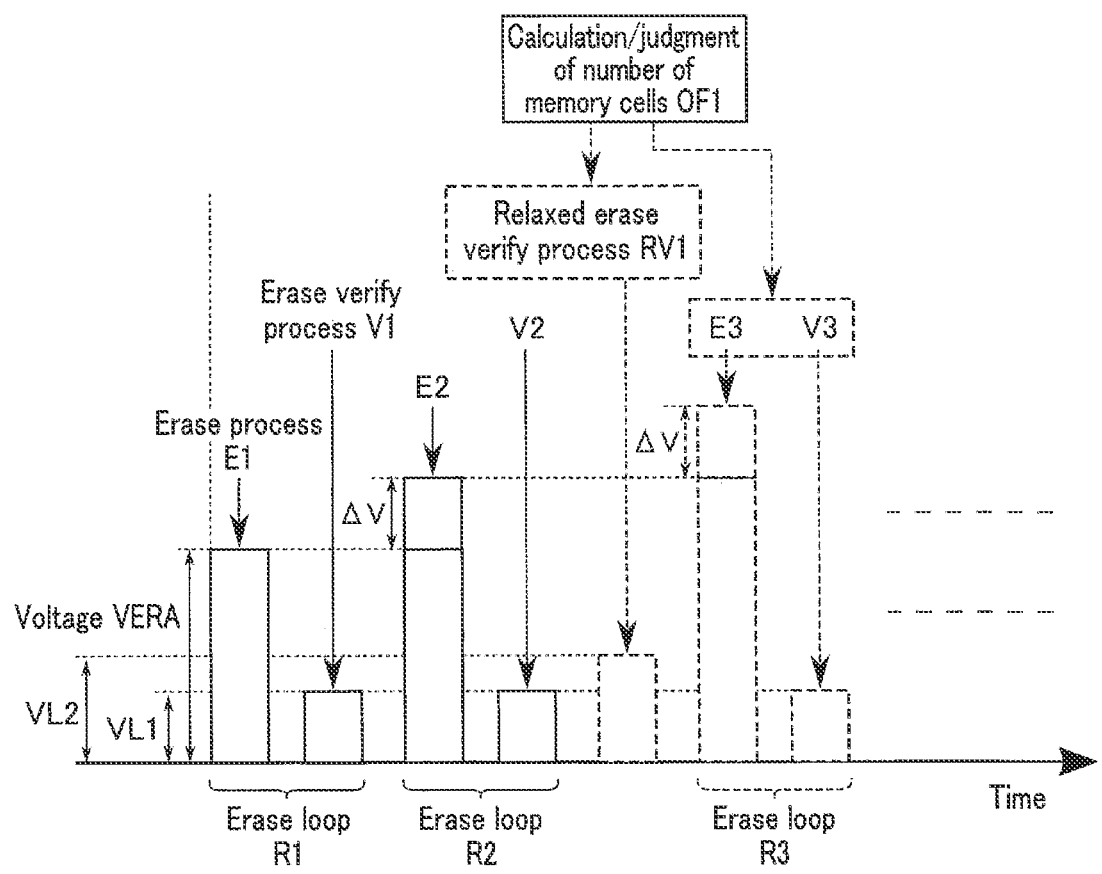
FIG. 12 is a diagram illustrating an outline of an erase operation of a semiconductor memory device of a second embodiment.

Erase operation in the semiconductor memory device 10 of the second embodiment will be explained. FIG. 12 is a diagram illustrating an outline of the erase operation of the semiconductor memory device 10.

The erase operation of the second embodiment includes an erase process, an erase verify process, calculation/judgement of the number of memory cells OF1, and a "relaxed erase verify process".

The erase process, the erase verify process, and calculation/judgement of the number of memory cells OF1 are same as those in the first embodiment. The relaxed erase verify process relates to an operation of verifying data erasure directed to the memory cell transistors MT, executed by using a verify level higher than that in the erase verify process.

FIG. 12 illustrates a first erase loop R1, a second erase loop R2, and a third erase loop R3. The erase loop R1 includes an erase process E1 and an erase verify process V1. The erase loop R2 includes an erase process E2 and an erase verify process V2. The erase loop R3 includes an erase process E3 and an erase verify process V3.

In the second embodiment, the calculation/judgment of the number of memory cells OF1 takes place after execution of the erase loop R2, and the relaxed erase verify process RV1 or the erase loop R3 takes place, depending on result of the calculation/judgment of the number of memory cells OF1. That is, in the second embodiment, when the number of memory cells OF1 having transitioned from the ON state to the OFF state has exceeded the criterion, the relaxed erase verify process RV1 takes place to verify whether the erase target block could be utilized other than being used as the erased block. On the other hand, when the number of memory cells OF1 has not exceeded the criterion, the erase loop R3 takes place.

2.2.2 Details of Erase Operation

Figure 13:
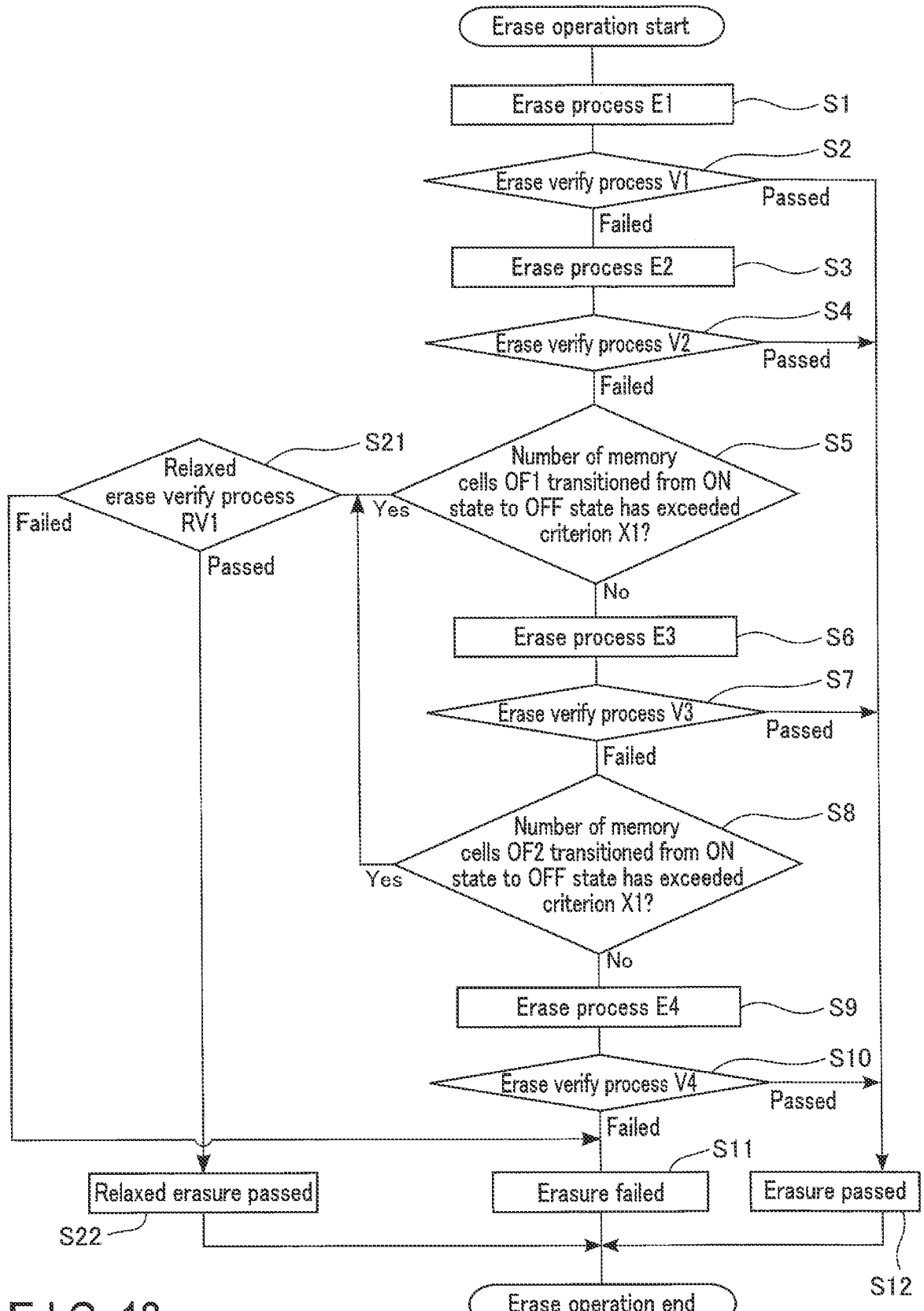
FIG. 13 is a flow chart illustrating the erase operation in the semiconductor memory device of the second embodiment.

Erase operation in the semiconductor memory device 10 of the second embodiment will be detailed below. FIG. 13 is a flow chart illustrating an erase operation in the semiconductor memory device 10. This operation is controlled by the sequencer 16.

Upon start of the erase operation, the sequencer 16 executes the erase process E1 on the erase target block BLK, with use of the erase voltage VERA (S1). More specifically, the sequencer 16 applies erase voltage VERA to the source line CELSRC, to cause transition of the threshold voltage of the memory cell transistors MT in the block BLK towards the state Er.

Next, the sequencer 16 executes the erase verify process V1 on the erase target block BLK, by using the verify level VL1 (S2). That is, the sequencer 16 executes the read operation for determining the erase state of the memory cell transistors MT after the execution of the erase process E1, while using the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the off-bit number F1 of the memory cell transistors MT in the OFF state, by the read operation with use of the verify level VL1 in the erase verify process V1. As a result of such read operation, the sequencer 16 further acquires information of the memory cell transistor MT in the ON state. The information on the memory cell transistor MT in the ON state may be acquired, typically by storing data read from the memory cell transistor MT in a first latch circuit of the sense amplifier unit SAUr.

The sequencer 16 determines whether the off-bit number F1 obtained in the read operation has exceeded a predetermined value, or not (S2). When the off-bit number F1 has exceeded the predetermined value (failed), the sequencer 16 judges that the erase target block after execution of the erase process E1 has failed in the erase verification, and advances to step S3. On the other hand, when the off-bit number F1 has not exceeded the predetermined value (passed), the sequencer 16 judges that the erase target block has passed the erase verification, and advances to step S12. The erase target block is then managed as a usable erased block (S12).

Next, when failure in the erase verify process V1 was judged, the sequencer 16 executes the erase process E2 on the erase target block BLK, with use of erase voltage "VERA+ΔV" (S3). More specifically, the erase voltage "VERA+ΔV" is applied to the source line CELSRC, to cause further transition of the threshold voltage of the memory cell transistors MT in the block BLK towards the state Er.

Next, the sequencer 16 executes the erase verify process V2 on the erase target block BLK, by using the verify level VL1 (S4). That is, the sequencer 16 executes the read operation for judging the erase state of the memory cell transistors MT after the execution of the erase process E2, with use of the verify level VL1 as the read voltage. More specifically, the sequencer 16 applies the verify level VL1 to the word line WL to be judged in the erase target block, and executes the read operation on the memory cell transistor MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the off-bit number F2 of the memory cell transistors MT in the OFF state, by the read operation with use of the verify level VL1 in the erase verify process V2. As a result of such read operation, the sequencer 16 further acquires information of the memory cell transistor MT in the ON state. The information on the memory cell transistor MT in the ON state may be acquired, typically by storing data read from the memory cell transistor MT in a second latch circuit of the sense amplifier unit SAUr.

The sequencer 16 determines whether the off-bit number F2 obtained in the read operation has exceeded a predetermined value, or not. When the off-bit number F2 has exceeded the predetermined value (failed), the sequencer 16 judges that the erase target block after execution of the erase process E2 has failed in the erase verification, and advances to step S5. On the other hand, when the off-bit number F2 has not exceeded the predetermined value (passed), the sequencer 16 judges that the erase target block has passed the erase verification, and advances to step S12. The erase target block is then managed as a usable erased block (S12).

Next, when failure in the erase verify process V2 was judged, the sequencer 16 judges whether the number of memory cells OF1 of the memory cell transistor MT, having transitioned from the ON state in the erase verify process V1 to the OFF state in the erase verify process V2, exceeds a criterion X1, or not (S5). That is, the sequencer 16 judges whether the number of the memory cells OF1 of the memory cell transistor MT, once in the ON state in the erase verify process V1 and then turned into the OFF state in the erase verify process V2, exceeds the criterion X1, or not.

Figure 14:
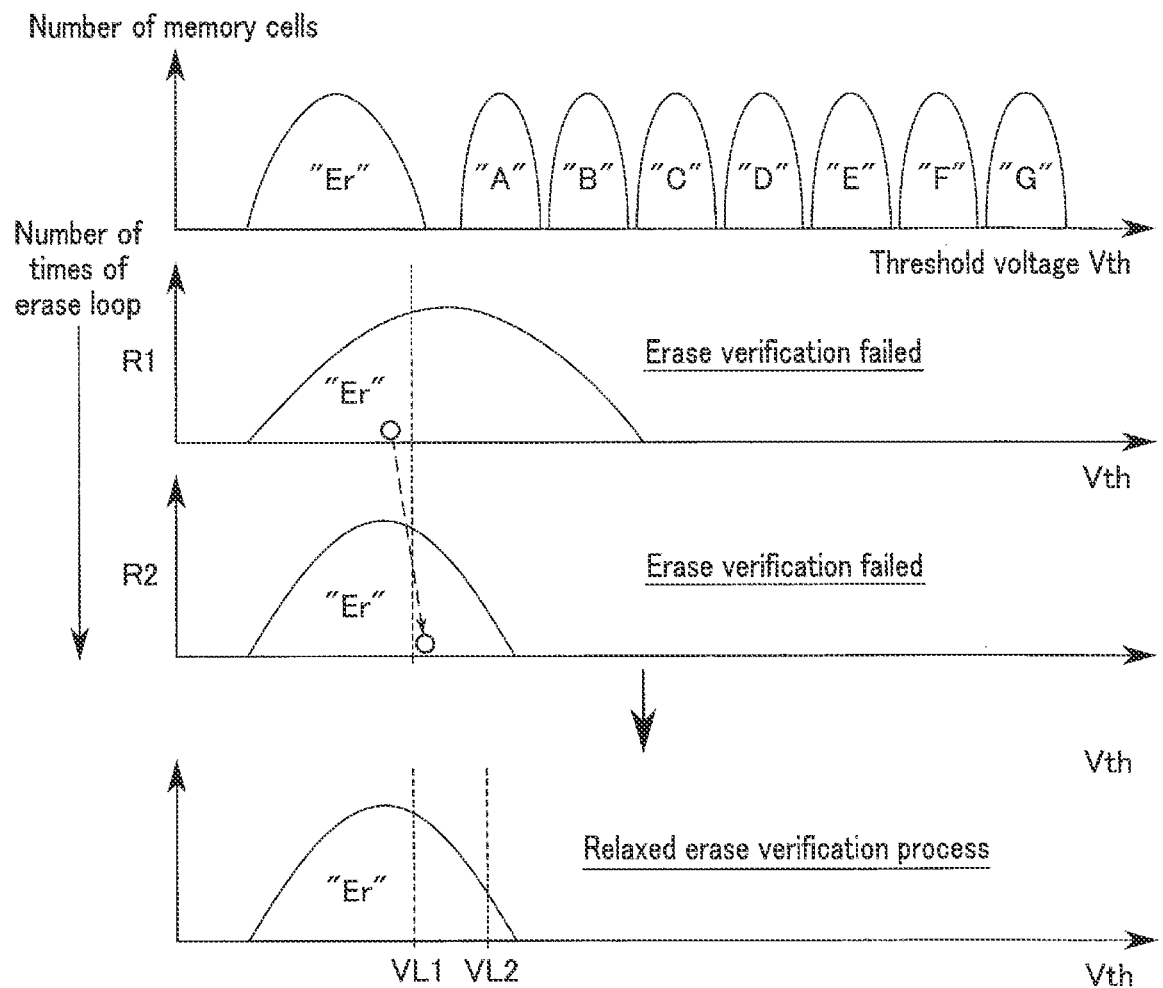
FIG. 14 is a diagram illustrating transition of the threshold voltage distribution of the memory cell transistor, as a result of the erase operation according to the second embodiment.

Next, when the number of memory cells OF1 has exceeded the criterion X1 (Yes) in step S5, the sequencer 16 advances to step S21. Then as illustrated in FIG. 14, the sequencer 16 executes the relaxed erase verify process RV1 on the erase target block BLK, by using the verify level VL2 (S21). That is, the sequencer 16 executes the read operation for judging the erase state of the memory cell transistors MT after the execution of the erase process E2, with use of the verify level VL2, which is higher than the verify level VL1, as the read voltage. More specifically, the sequencer 16 applies the verify level VL2 to the word line WL to be judged in the erase target block, and executes the read operation on the memory cell transistor MT to be judged. In the read operation, the memory cell transistor MT whose threshold voltage is equal to or lower than the verify level VL2 is turned ON, meanwhile the memory cell transistor MT whose threshold voltage is higher than the verify level VL2 is turned OFF.

The sequencer 16 acquires the number of memory cell transistors MT in the OFF state, by the read operation with use of the verify level VL2 in the relaxed erase verify process RV1. The number of memory cell transistors MT in the OFF state in the relaxed erase verify process RV1 will be referred to as off-bit number RF1, hereinafter.

The sequencer 16 judges whether the off-bit number RF1 obtained in the read operation has exceeded a predetermined value, or not. When the off-bit number RF1 has exceeded the predetermined value (failed), the sequencer 16 judges that the erase target block after execution of the erase process E2 has failed in the relaxed erase verification, and advances to step S11. The erase target block is then managed as an unusable bad block (S11). With the judgment in steps S5 and S21, the sequencer 16 can rapidly recognize degradation of the erase characteristic of the memory cell transistors MT in the erase target block, and can stop execution of the subsequent erase loop on the erase target block.

On the other hand, when the off-bit number RF1 has not exceeded the predetermined value (passed), the sequencer 16 judges that the erase target block has passed the erase verification, and advances to step S22. The erase target block is then managed as a relaxed-erased block (S22). How to use the relaxed-erased block will be described later.

Meanwhile, when the number of memory cells OF1 has not exceeded the criterion X1 (No) in step S5, the sequencer 16 executes the erase process E3 on the erase target block BLK, with use of erase voltage "VERA+2ΔV" (S6). More specifically, the erase voltage "VERA+2ΔV" is applied to the source line CELSRC, to cause further transition of the threshold voltage of the memory cell transistors MT in the block BLK towards the state Er.

Next, the sequencer 16 executes the erase verify process V3 on the erase target block BLK, by using the verify level VL1 (S7). That is, the sequencer 16 executes the read operation for judging the erase state of the memory cell transistors MT after the execution of the erase process E3, with use of the verify level VL1 as the read voltage. More specifically, the sequencer 16 applies the verify level VL1 to the word line WL to be judged in the erase target block, and executes the read operation on the memory cell transistor MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the off-bit number F3 of the memory cell transistors MT in the OFF state, by the read operation with use of the verify level VL1 in the erase verify process V3. As a result of such read operation, the sequencer 16 further acquires information of the memory cell transistor MT in the ON state. The information on the memory cell transistor MT in the ON state may be acquired, typically by storing data read from the memory cell transistor MT in a third latch circuit of the sense amplifier unit SAUr.

The sequencer 16 judges whether the off-bit number F3 obtained in the read operation has exceeded a predetermined value, or not. When the off-bit number F3 has exceeded the predetermined value (failed), the sequencer 16 judges that the erase target block after execution of the erase process E3 has failed in the erase verification, and advances to step S8. On the other hand, when the off-bit number F3 has not exceeded the predetermined value (passed), the sequencer 16 judges that the erase target block has passed the erase verification, and advances to step S12. The erase target block is then managed as a usable erased block (S12).

Next, when failure in the erase verify process V3 was judged, the sequencer 16 judges whether the number of memory cells OF2 of the memory cell transistors MT, having transitioned from the ON state in the erase verify process V2 to the OFF state in the erase verify process V3, exceeds a criterion X1, or not (S8). That is, the sequencer 16 judges whether the number of the memory cells OF2 of the memory cell transistors MT, having been in the ON state in the erase verify process V2 and then turned into the OFF state in the erase verify process V3, exceeds the criterion X1, or not.

Next, when the number of memory cells OF2 has exceeded the criterion X1 (Yes) in step S8, the sequencer 16 advances to step S21. Next, the sequencer 16 executes the relaxed erase verify process RV1 on the erase target block BLK, by using the verify level VL2 (S21). That is, the sequencer 16 executes the read operation for judging the erase state of the memory cell transistors MT after the execution of the erase process E3, with use of the verify level VL2 which is higher than the verify level VL1. More specifically, the sequencer 16 applies the verify level VL2 to the word line WL to be judged in the erase target block, and executes the read operation on the memory cell transistors MT to be judged. In the read operation, the memory cell transistor MT whose threshold voltage is equal to or lower than the verify level VL2 is turned ON, meanwhile the memory cell transistor MT whose threshold voltage is higher than the verify level VL2 is turned OFF.

The sequencer 16 acquires the number of memory cell transistors MT in the OFF state, by the read operation with use of the verify level VL2 in the relaxed erase verify process RV1. The number of memory cell transistors MT in the OFF state in the relaxed erase verify process RV1 will be referred to as off-bit number RF2, hereinafter.

The sequencer 16 judges whether the off-bit number RF2 obtained in the read operation has exceeded a predetermined value, or not. When the off-bit number RF2 has exceeded the predetermined value (failed), the sequencer 16 judges that the erase target block after execution of the erase process E3 has failed in the relaxed erase verification, and advances to step S11. The erase target block is then managed as an unusable bad block (S11). With the judgment in steps S8 and S21, the sequencer 16 can rapidly recognize degradation of the erase characteristic of the memory cell transistors MT in the erase target block, and can stop execution of the subsequent erase loop on the erase target block.

On the other hand, when the off-bit number RF2 has not exceeded the predetermined value (passed), the sequencer 16 judges that the erase target block has passed the relaxed erase verification, and advances to step S22. The erase target block is then managed as a relaxed-erased block (S22). How to use the relaxed-erased block will be described later.

Meanwhile, when the number of memory cells OF2 has not exceeded the criterion X1 (No) in step S8, the sequencer 16 executes the erase process E4 on the erase target block BLK, with use of erase voltage "VERA+3ΔV" (S9). More specifically, the erase voltage "VERA+3ΔV" is applied to the source line CELSRC, to cause further transition of the threshold voltage of the memory cell transistors MT in the block BLK towards the state Er.

Next, the sequencer 16 executes the erase verify process V4 on the erase target block BLK, by using the verify level VL1 (S10). That is, the sequencer 16 executes the read operation for judging the erase state of the memory cell transistors MT after the execution of the erase process E4, with use of the verify level VL1 as the read voltage. More specifically, the sequencer 16 applies the verify level VL1 to the word line WL to be judged in the erase target block, and executes the read operation on the memory cell transistors MT to be judged. In the read operation, the memory cell transistor MT whose threshold voltage is equal to or lower than the verify level VL1 is turned ON, meanwhile the memory cell transistor MT whose threshold voltage is higher than the verify level VL1 is turned OFF.

The sequencer 16 acquires the off-bit number F4 of the memory cell transistors MT in the OFF state, by the read operation with use of the verify level VL1 in the erase verify process V4.

The sequencer 16 judges whether the off-bit number F4 obtained in the read operation has exceeded a predetermined value, or not. When the off-bit number F4 has exceeded the predetermined value (failed), the sequencer 16 judges that the erase target block after execution of the erase process E4 has failed in the erase verification, and advances to step S11. The erase target block is then managed as an unusable bad block (S11). On the other hand, when the off-bit number F4 has not exceeded the predetermined value (passed), the sequencer 16 judges that the erase target block has passed the erase verification, and advances to step S12. The erase target block is then managed as a usable erased block (S12). The erase operation thus comes to the end.

Similarly to the first embodiment, the aforementioned erase operation exemplifies a case where the maximum number of times of erase loop is set to four. For a case where the maximum number of times of erase loop is set to a number larger than four, the erase loop will further be repeated until the erase verification is passed, or until the maximum number of times of the erase loop is reached.

How to use the relaxed-erased block will be described below. Upon passing of the erase verification in the relaxed erase verify process RV1 in step S21, the sequencer 16 manages the erase target block as the relaxed-erased block.

For example, the relaxed-erased block is usable in four ways (1) to (4) below.
(1) The relaxed-erased block is used on the premise that it might be less reliable, since such block has a threshold distribution of the state Er with the upper tail thereof extended to a higher level, as compared with a block that has normally passed any of the erase verify processes V1 to V4 (referred to as erased block, hereinafter).
(2) In the write operation, the write loop that includes the write process and the write verify process is repeated, until the threshold voltages of the memory cell transistors MT exceed the write verify level. The write process relates to an operation of applying (or supplying) a write voltage VPGM to the gate electrodes (or, the word line WL) of the memory cell transistors MT, to inject electric charge into the charge storage layer of the memory cell transistors MT, thereby elevating the threshold voltages of the memory cell transistors MT. The write verify process relates to an operation of verifying whether or not the threshold voltages of the memory cell transistors MT have reached the write verify level.

In the write operation directed to the memory cell transistor MT in the relaxed-erased block, the write verify levels set to the individual states are set higher than the write verify levels set to the individual states of the memory cell transistor MT in the erased block. This brings up the lower tail level of distribution of the threshold voltage written in the memory cell transistors MT, and enhances the reliability of the data stored in the memory cell transistor MT.
(3) In the write operation, the write loop that includes the write process and the write verify process is repeated, until the threshold voltages of the memory cell transistors MT exceed the write verify level. The write voltage VPGM used in the write process is incremented by voltage ΔV, every time the write loop is repeated. In the write operation directed to the memory cell transistor MT in the relaxed-erased block, the voltage ΔV set in the write process directed to the relaxed-erased block is set to a voltage smaller than the voltage ΔV set in the write process directed to the erased block. This successfully enhances the reliability in the write operation.
(4) For a case where the TLC or QLC method is employed in the memory cell transistors MT in the erased block, the MLC method will be applied to the memory cell transistors MT in the relaxed-erased block. With the storage capacity of one memory cell transistor MT thus reduced, the individual states of the memory cell transistor MT will have widened intervals of the threshold voltage distributions. This successfully enhances the reliability of data stored in the memory cell transistor MT.

2.2.3 Voltage Waveforms of Erase Operation

Figure 15:
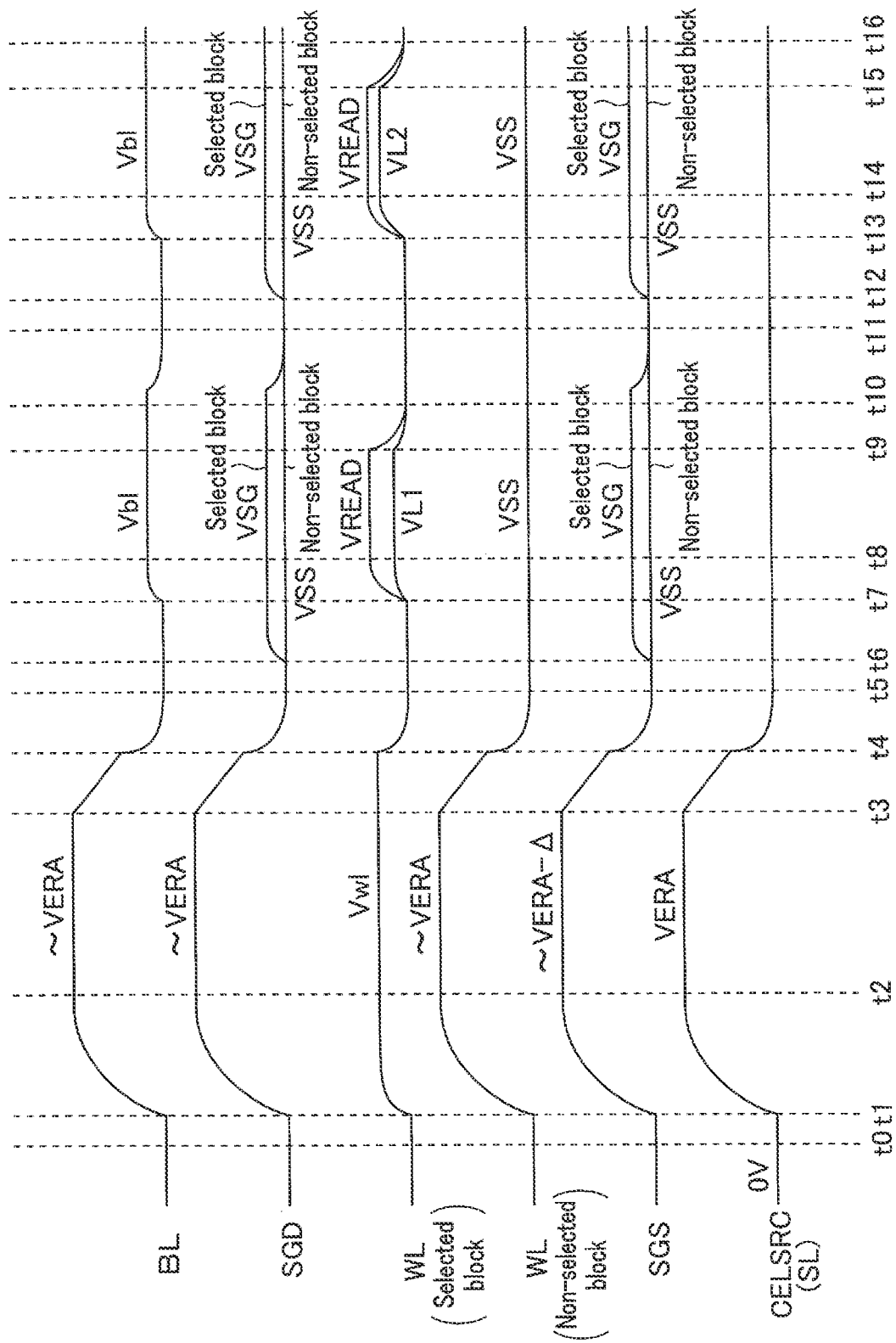
FIG. 15 is a diagram illustrating voltage waveforms of signals in the erase operation of the second embodiment.

The paragraphs below will explain voltage waveforms of the source line CELSRC, the word line WL, the select gate lines SGD and SGS, and the bit line BL, in the erase operation that includes the erase process, the erase verify process, and the relaxed erase verify process. FIG. 15 is a diagram illustrating voltage waveforms of the individual signals in the erase process, the erase verify process, and the relaxed erase verify process. The explanation herein will be made on the erase process E1, the erase verify process V1, and the relaxed erase verify process RV1.

In FIG. 15, the erase process E1 takes place in the time t0 to t5, the erase verify process V1 takes place in the time t5 to t10, and the relaxed erase verify process RV1 takes place in the time t11 to t16.

The erase process E1 in the time t0 to t5, and the erase verify process V1 in the time t5 to t10 are similar to those in the first embodiment.

The relaxed erase verify process RV1 in the time t11 to t16 will be described below.

At time t12, the row decoder 18 applies the voltage VSG to the select gate lines SGD and SGS of the selected block. The voltage VSG turns on the select transistors ST1 and ST2.

Next, in the time t13 to t15, the row decoder 18 applies the verify level VL2 to the word line WL to be judged of the erase target block. The verify level VL2 is a read voltage used for judging the erase state of the memory cell transistors MT in the erase target block. The verify level VL2 is higher than the verify level VL1. The row decoder 18 also applies the voltage VREAD to the word lines WL not to be judged.

This makes the sense amplifiers 21 sense and amplify the data read onto the bit lines BL. In accordance with the read result, the sequencer 16 judges whether the memory cell transistors MT have passed or failed in the erase verification, as described previously.

Figure 16:
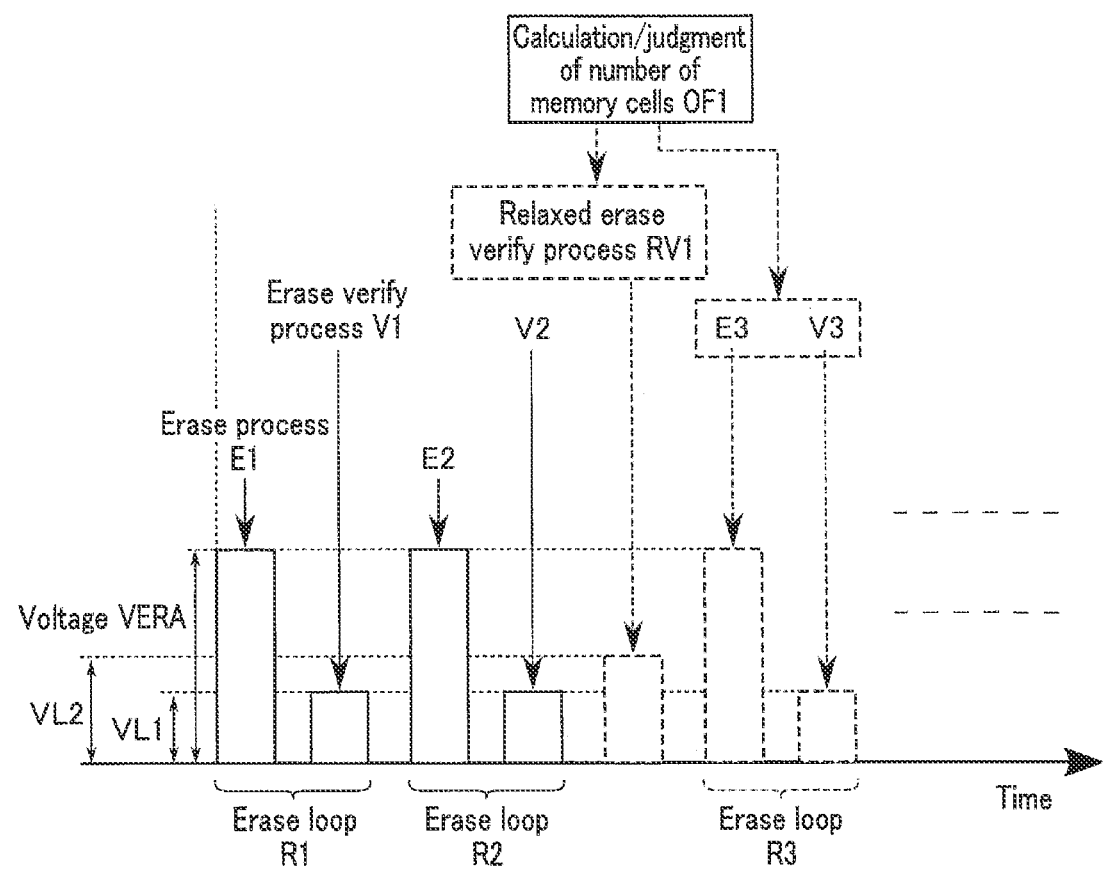
FIG. 16 is a diagram illustrating an outline of other erase operation of the semiconductor memory device of the second embodiment.

Having described in the embodiment above that the erase voltage VERA in the erase processes E1 to E4 increments by ΔV, the present invention is not limited thereto. There may also be a case as illustrated in FIG. 16, where the erase voltage VERA in the erase processes E1 to E4 is set constant.

2.3 Effect of Second Embodiment

The second embodiment can provide a semiconductor memory device capable of enhancing performance of the erase operation.

The effect of the second embodiment will be explained below.

The second embodiment calculates the number of memory cells OF1 (or OF2) of the memory cell transistors MT in the erase target block, having been turned ON by the first erase verification, and then turned OFF by the second erase verification subsequent to the first erase verification. In other words, the second embodiment calculates the number of memory cells OF1 of the memory cell transistors MT in the erase target block, having passed the first erase verification, and then failed in the subsequent second erase verification. The sequencer 16 then judges whether the number of memory cells OF1 has exceeded the criterion X1 or not. When the number of memory cells OF1 has exceeded the criterion X1, the second embodiment will not handle the erase target block as the bad block, and will instead execute thereon a third erase verification with use of a second verify level which is higher than the first verify level used in the first and the second erase verifications. When the erase target block passed the third erase verification, the erase target block is then managed as the aforementioned relaxed-erased block. On the other hand, when the erase target block failed in the third erase verification, the erase target block is then managed as the bad block.

The erase target block, having passed the third erase verification, and therefore been managed as the relaxed-erased block will become usable more effectively, making it possible to enhancing memory performance of the semiconductor memory device.

On the other hand, management of the erase target block, having failed in the third erase verification, as the bad block will suppress execution of the subsequent erase loop for the erase target block, making it possible to reduce unnecessary consumption of the resource. Moreover, since the erase target block will be subjected to the subsequent write operation and erase operation, after passing the erase verification, so that the memory cell transistor MT in such block may be prevented from degrading the characteristic.

As described above, the semiconductor memory device of the second embodiment can enhance performance of the erase operation.

3. Third Embodiment

A semiconductor memory device of a third embodiment will be explained. The third embodiment will explain a case where the erase verify process in the first embodiment was executed by NAND string as a unit. Any unexplained configuration, operation, and effect of the semiconductor memory device are same as those in the first embodiment.

3.1 Operation of Third Embodiment

The third embodiment executes the erase verify process for every NAND string NS. More specifically, from among a plurality of NAND strings NS connected to one bit line, only one NAND string NS is judged whether it has transitioned from passing to failure in the erase verification or not. For example, assuming now the left NAND string in FIG. 4 is denoted as NS0, and the right as NS1, only the NAND string NS0 is judged whether or not it has transitioned from passing in the previous erase verify process to failure in the present erase verification process. Each of bit lines has individually connected thereto the NAND string NS0, and each NAND string NS0 is judged whether it has transitioned from passing to failure in the erase verification or not.

Figure 17:
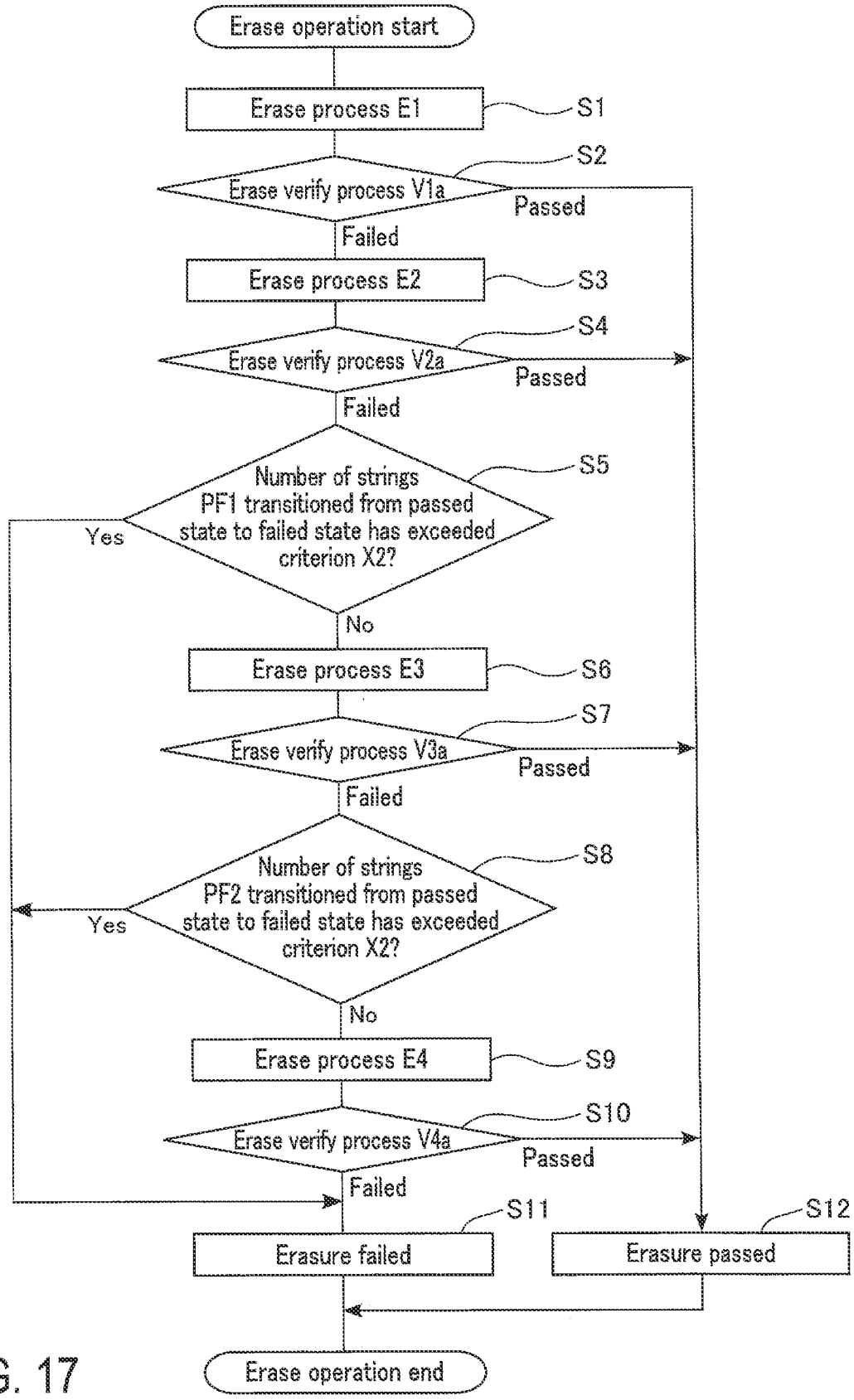
FIG. 17 is a flow chart illustrating an erase operation in a semiconductor memory device of a third embodiment.

FIG. 17 is a flow chart illustrating an erase operation in the semiconductor memory device 10 of the third embodiment. This operation is controlled by the sequencer 16. The explanation herein will be made mainly focusing the points different from the flow chart in FIG. 9.

In each of the erase verify processes V1a to V4a respectively in steps S2, S4, S7 and S10, the verify level VL1 is supplied to the word lines WL0 to WL7 illustrated in FIG. 4, and whether or not the threshold voltages of the memory cell transistors MT0 to MT7 of each of the NAND strings NS are lower than the verify level VL1 is judged. When the threshold voltages of the memory cell transistors MT0 to MT7 are lower than the verify level VL1, the NAND string NS will be assumed to pass the erase verification. In the third embodiment, the sequencer 16 thus judges whether the memory cell transistors MT have passed the erase verification by NAND string as a unit. Whether or not each of the NAND strings NS included in one block has passed the erase verification is stored in a latch circuit connected to each bit line.

For a case where the erase verify process V1a takes place and the erase verify process V2a then follows in the next erase loop, the sequencer 16 calculates in Step S5 the number of NAND strings NS0 that has passed the erase verify process V1a but failed in the erase verify process V2a (number of strings PF1, hereinafter). The sequencer 16 then judges whether the number of strings PF1 has exceeded the criterion X2 or not. That is, the sequencer 16 judges whether or not the number of strings PF1 of the NAND string NS0, having transitioned from passing in the erase verify process V1a to failure in the erase verify process V2a, has exceeded the criterion X2. The judgment is made by comparing the data stored in the latch circuit in the erase verify process V1a, with the data obtained in the erase verify process V2a, and by further comparing the result of comparison with the criterion X2. Note that the other NAND strings including the NAND string NS1 will not be subjected to the calculation/judgment of the number of strings PF1.

When the number of strings PF1 has exceeded the criterion X2 (Yes) in step S5, the sequencer 16 advances the process to step S11. On the other hand, when the number of strings PF1 has not exceeded the criterion X2 (No), the sequencer 16 advances the process to step S6.

For a case where the erase verify process V2a takes place and the erase verify process V3a then follows, the sequencer 16 calculates in Step S8 the number of NAND strings NS0 that has passed the erase verify process V2a but failed in the erase verify process V3a (number of strings PF2, hereinafter). The sequencer 16 then judges whether the number of strings PF2 has exceeded the criterion X2 or not. That is, the sequencer 16 judges whether or not the number of strings PF2 of the NAND string NS0, having transitioned from passing in the erase verify process V2a to failure in the erase verify process V3a, has exceeded the criterion X2. The judgment is made by comparing the data stored in the latch circuit in the erase verify process V2a, with the data obtained in the erase verify process V3a, and by further comparing the result of comparison with the criterion X2. Note that the other NAND strings including the NAND string NS1 will not be subjected to the calculation/judgment of the number of strings PF1.

When the number of strings PF2 has exceeded the criterion X2 (Yes) in step S8, the sequencer 16 advances the process to step S11. On the other hand, when the number of strings PF2 has not exceed the criterion X2 (No), the sequencer 16 proceeds the process to step S9.

The third embodiment thus executes the erase verify process for every NAND string NS. Moreover, from among a plurality of NAND strings NS connected to one bit line, only one NAND string is subjected to calculation/judgment of the number of strings PF1 or PF2.

3.2 Modified Example of Third Embodiment

In the aforementioned third embodiment, the erase verify process has supplied the verify level VL1 to all of the word lines WL0 to WL7 illustrated in FIG. 4. In contrast in the present modified example, the verify level VL1 is alternately supplied to the even-numbered word lines (WL0, WL2, WL4 and WL6, for example) and the odd-numbered word lines (WL1, WL3, WL5 and WL7, for example) in FIG. 4. For example, the verify level VL1 is supplied to the even-numbered word lines, while supplying so-called pass voltage, which is higher than the verify level VL1, to the odd-numbered word lines. First, only the even-numbered word lines are judged whether they have passed or failed in the erase verification, and then also the odd-numbered word lines are judged whether they have passed or failed in the erase verification. With both word lines judged to have passed, the erase verification is assumed to be passed.

Now in this modified example, for example, the data representing whether the erase verification has passed or not, obtained in the previous erase verify process directed only to the even-numbered word lines, is stored in the latch circuit connected to the bit line. Also in the erase verify process in the next erase loop, whether the erase verification has passed or not, is judged for the even-numbered word lines and the odd-numbered word lines. For the NAND string NS0 that has passed the previous erase verify process but has failed in the current erase verify process, the judgment is made by comparing the previous data in the latch circuit and the present data, only when the verify level VL1 is supplied to the even-numbered word lines.

As described above, the calculation/judgment of the number of strings PF1 or PF2 in this modified example is directed only for any one of the NAND strings NS connected to the bit line, and for either the even-numbered word lines or the odd-numbered word lines. Note that the calculation/judgment of the number of strings PF1 or PF2 will not be directed for the other NAND strings including the NAND string NS1.

3.3 Effect of Third Embodiment

The third embodiment and the modified example can provide a semiconductor memory device capable of enhancing performance of the erase operation.

The effect of the third embodiment and the modified example will be explained below.

In the third embodiment and the modified example, the calculation/judgment of the number of strings PF1 (or PF2) is directed only for the NAND string NS0, from among the NAND strings NS connected to the bit line. That is, in the NAND strings NS0 in the erase target block, the number of strings PF1 of the NAND strings NS0, having passed the first erase verification and then failed in the subsequent second erase verification, is calculated. The sequencer 16 then judges whether the number of strings PF1 has exceeded the criterion X2 or not. When the number of strings PF1 has exceeded the criterion X2, the erase target block may be judged to be degraded, and may be handled as a bad block.

This advantageously suppresses execution of subsequent erase loop on the erase target block, reducing unnecessary consumption of the resource. Moreover, since the erase target block will be subjected to the subsequent write operation and erase operation, after passing the erase verification, so that the memory cell transistor MT in such block may be prevented from degrading the characteristic.

As described above, the semiconductor memory devices of the third embodiment and the modified example can enhance the performance of erase operation.

4. Fourth Embodiment

A semiconductor memory device of a fourth embodiment will be explained. The fourth embodiment will explain a case where the erase verify process in the second embodiment was executed by NAND string as a unit. Any unexplained configuration, operation, and effect of the semiconductor memory device are same as those in the second embodiment.

The aforementioned erase verify process in the second embodiment may also be executed by NAND string as a unit, similarly to as in the third embodiment. Also in this case, the erase verification takes place for every NAND string NS. Moreover, each NAND string NS0 individually connected to the bit lines is judged whether it has transitioned from passing to failure in the erase verification or not.

Figure 18:
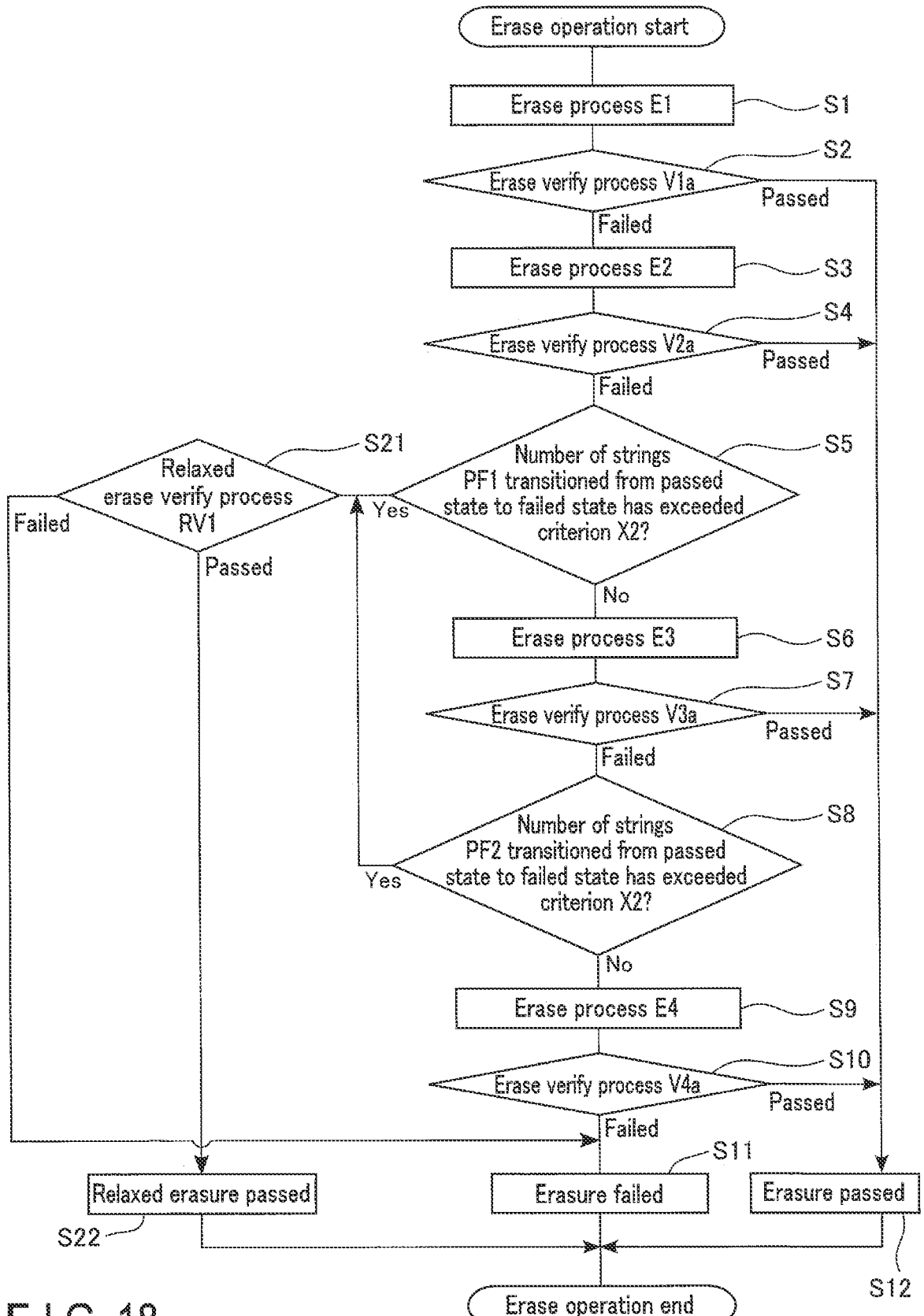
FIG. 18 is a flow chart illustrating an erase operation in a semiconductor memory device of a fourth embodiment.

FIG. 18 is a flow chart illustrating an erase operation in the semiconductor memory device 10 of the fourth embodiment. This operation is controlled by the sequencer 16.

The erase verify processes V1a to V4a respectively in steps S2, S4, S7 and S10, and the calculation/judgment of the number of strings PF1 and PF2 respectively in steps S5 and SB are same as those in the third embodiment.

4.2 Modified Example of Fourth Embodiment

Similarly to the modified example of the third embodiment, the calculation/judgment of the number of strings PF1 or PF2 in this modified example is directed only for any one of the NAND strings NS connected to the bit line, and for either the even-numbered word lines or the odd-numbered word lines. Note that the calculation/judgment of the number of strings PF1 or PF2 will not be directed for the other NAND strings including the NAND string NS1.

4.3 Effect of Fourth Embodiment

The fourth embodiment and the modified example can provide a semiconductor memory device capable of enhancing performance of the erase operation.

The effect of the fourth embodiment and the modified example will be explained below.

In the fourth embodiment and the modified example, the calculation/judgment of the number of strings PF1 (or PF2) is directed only for the NAND string NS0, from among the NAND strings NS connected to the bit line. That is, in the NAND strings NS0 in the erase target block, the number of strings PF1 of the NAND strings NS0, having passed the first erase verification and then failed in the subsequent second erase verification, is calculated. The sequencer 16 then judges whether the number of strings PF1 has exceeded the criterion X2 or not. When the number of strings PF1 has exceeded the criterion X2, the erase target block may be judged to be degraded, and may be handled as a bad block.

This advantageously suppresses execution of subsequent erase loop on the erase target block, reducing unnecessary consumption of the resource. Moreover, since the erase target block will be subjected to the subsequent write operation and erase operation, after passing the erase verification, so that the memory cell transistor MT in such block may be prevented from degrading the characteristic.

As described above, the semiconductor memory device of the fourth embodiment and the modified example can enhance the performance of erase operation.

5. Other Modifications

The functional blocks described in the aforementioned embodiments may be materialized by hardware, computer software, or a combination of both. The functional block is not essentially distinguished as described below. For example, a part of the function may be executed by any other functional block different from the exemplary functional block. The exemplary functional block may further be divided into smaller functional sub-blocks. In the flowcharts explained in the aforementioned embodiment, the order of process may be changed to a maximum extent.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cells; and
a control circuit configured to control an erase operation on the plurality of memory cells,
wherein the erase operation including an erase process and an erase verify process, the erase process applying an erase voltage to the plurality of memory cells, the erase verify process determining a threshold voltage of each of the plurality of memory cells after the erase process,
the control circuit sequentially executes, in the erase operation, a first erase process, a first erase verify process, a second erase process, and a second erase verify process on the plurality of memory cells,
acquires, in the first erase verify process, a number of first memory cells having a threshold voltage equal to or lower than a first verify voltage, from among the plurality of memory cells,
acquires, in the second erase verify process, a number of second memory cells having a threshold voltage higher than the first verify voltage, from among the first memory cells, and
stops the erase operation, in response to determining that the number of second memory cells is larger than a first predetermined value associated with a number of memory cells.

2. The semiconductor memory device according to claim 1,
wherein, in the second erase verify process, the control circuit makes the plurality of memory cells unusable.

3. The semiconductor memory device according to claim 1, further comprising an interconnect layer connected to the plurality of memory cells,
wherein, in the first erase process, a first erase voltage is supplied to the interconnect layer, in the second erase process, a second erase voltage is supplied to the interconnect layer, and
the second erase voltage is different from the first erase voltage.

4. The semiconductor memory device according to claim 1, further comprising an interconnect layer connected to the plurality of memory cells,
wherein, in the first erase verify process and in the second erase verify process, a first verify voltage is supplied to the interconnect layer.

5. The semiconductor memory device according to claim 1, further comprising:
a first word line arranged to extend in a first direction; and
a plurality of pillars arranged to extend in a second direction that intersects the first direction, and to pass the first word line,
wherein the plurality of memory cells are arranged at intersections of the first word line and the pillars.

6. The semiconductor memory device according to claim 1, further comprising:
a plurality of conductive layers arranged to extend in a first direction, and to be stacked on a substrate; and
a plurality of pillars arranged to extend in a second direction that intersects the first direction, and to pass the conductive layers,
wherein the plurality of memory cells are arranged at intersections of the conductive layers and the pillars.

7. The semiconductor memory device according to claim 1, further comprising a NAND flash memory in which the plurality of memory cells are arranged in three-dimensionally.

8. A semiconductor memory device comprising:
a plurality of memory cells; and
a control circuit configured to control an erase operation on the plurality of memory cells,
wherein
the erase operation includes an erase process and an erase verify process, the erase process applying an erase voltage to the plurality of memory cells, the erase verify process determining a threshold voltage of each of the plurality of memory cells after the erase process, and
the control circuit
sequentially executes, in the erase operation, a first erase process, a first erase verify process, a second erase process, and a second erase verify process on the plurality of memory cells,
acquires, in the first erase verify process, a number of first memory cells having a threshold voltage equal to or lower than a first verify voltage, from among the plurality of memory cells, and
acquires, in the second erase verify process, a number of second memory cells having a threshold voltage higher than the first verify voltage, from among the first memory cells, and
wherein, in response to determining that the number of second memory cells is equal to or smaller than a first predetermined value associated with a number of memory cells in the second erase verify process, the control circuit
sequentially executes a third erase process and a third erase verify process on the plurality of memory cells,
acquires, in the second erase verify process, third memory cells having a threshold voltage equal to or smaller than the first verify voltage, from among the plurality of memory cells, and
acquires, in the third erase verify process, a number of fourth memory cells having a threshold voltage larger than the first verify voltage, from among the third memory cells.

9. The semiconductor memory device according to claim 8, further comprising an interconnect layer connected to the plurality of memory cells,
wherein, in the first erase process, a first erase voltage is supplied to the interconnect layer, in the second erase process, a second erase voltage is supplied to the interconnect layer, and
the second erase voltage is different from the first erase voltage.

10. The semiconductor memory device according to claim 8, further comprising an interconnect layer connected to the plurality of memory cells,
wherein, in the first erase verify process and in the second erase verify process, a first verify voltage is supplied to the interconnect layer.

11. The semiconductor memory device according to claim 8, further comprising:
a first word line arranged to extend in a first direction; and
a plurality of pillars arranged to extend in a second direction that intersects the first direction, and to pass the first word line,
wherein the plurality of memory cells are arranged at intersections of the first word line and the pillars.

12. The semiconductor memory device according to claim 8, further comprising:
a plurality of conductive layers arranged to extend in a first direction, and to be stacked on a substrate; and
a plurality of pillars arranged to extend in a second direction that intersects the first direction, and to pass the conductive layers,
wherein the plurality of memory cells are arranged at intersections of the conductive layers and the pillars.

13. A semiconductor memory device comprising:
a plurality of memory cells; and
a control circuit configured to control an erase operation on the plurality of memory cells,
wherein
the erase operation includes an erase process and an erase verify process, the erase process applying an erase voltage to the plurality of memory cells, the erase verify process determining a threshold voltage of each of the plurality of memory cells after the erase process, and
the control circuit
sequentially executes, in the erase operation, a first erase process, a first erase verify process, a second erase process, and a second erase verify process on the plurality of memory cells,
acquires, in the first erase verify process, a number of first memory cells having a threshold voltage equal to or lower than a first verify voltage, from among the plurality of memory cells, and acquires, in the second erase verify process, a number of second memory cells having a threshold voltage higher than the first verify voltage, from among the first memory cells, and second memory cells is larger than a first predetermined value associated with a number of memory cells in the second erase verify process, the control circuit
executes a third erase verify process that determines the threshold voltage of the plurality of memory cells, with use of a second verify voltage higher than the first verify voltage, and
acquires, in the third erase verify process, a number of fifth memory cells having a threshold voltage higher than the second verify voltage, from among the plurality of memory cells.

14. The semiconductor memory device according to claim 13,
wherein, in response to determining that the number of fifth memory cells is equal to or smaller than a second number of memory cells in the third erase verify process,
the control circuit controls a first write operation on the plurality of memory cells, and a second write operation on sixth memory cells different from the plurality of memory cells,
the first write operation includes a write process which applies a write voltage to the plurality of memory cells, and a write verify process that determines the threshold voltages of the plurality of memory cells after the write process,
the second write operation includes a write process which applies the write voltage to the sixth memory cells, and a write verify process that determines the threshold voltages of the sixth memory cells after the write process, and
the first write verify voltage is higher than the second write verify voltage.

15. The semiconductor memory device according to claim 13,
wherein, in response to determining that the number of fifth memory cells is equal to or smaller than a second number of memory cells in the third erase verify process,
the control circuit controls a first write operation on the plurality of memory cells,
the first write operation includes a first write process that applies a first write voltage to the plurality of memory cells, and a first write verify process that determines threshold voltages of the plurality of memory cells after the first write process,
the second write operation includes a second write process that applies a second write voltage to the sixth memory cells, and a second write verify process that determines threshold voltages of the sixth memory cells after the second write process,
the control circuit repeatedly executes, in the first write operation, the first write process and the first write verify process until the threshold voltages of the plurality of memory cells exceed the write verify voltage,
the control circuit repeatedly executes, in the second write operation, the second write process and the second write verify process until the threshold voltages of the sixth memory cells exceed the write verify voltage,
the first write voltage of the first write process increments by a first voltage every time the first write process is repeated, the second write voltage of the second write process increments by a second voltage every time the second write process is repeated, and the first voltage is lower than the second voltage.

16. The semiconductor memory device according to claim 2, wherein, in response to determining that the number of fifth memory cells is equal to or smaller than a second number of memory cells in the third erase verify process, the control circuit reduces a storage capacity of at least one memory cell from among the plurality of memory cells.

17. The semiconductor memory device according to claim 13, further comprising an interconnect layer connected to the plurality of memory cells, wherein, in the first erase process, a first erase voltage is supplied to the interconnect layer, in the second erase process, a second erase voltage is supplied to the interconnect layer, and the second erase voltage is different from the first erase voltage.

18. The semiconductor memory device according to claim 13, further comprising an interconnect layer connected to the plurality of memory cells, wherein, in the first erase verify process and in the second erase verify process, a first verify voltage is supplied to the interconnect layer.

19. The semiconductor memory device according to claim 13, further comprising:

a first word line arranged to extend in a first direction; and a plurality of pillars arranged to extend in a second direction that intersects the first direction, and to pass the first word line, wherein the plurality of memory cells are arranged at intersections of the first word line and the pillars.

20. The semiconductor memory device according to claim 13, further comprising:

a plurality of conductive layers arranged to extend in a first direction, and to be stacked on a substrate; and a plurality of pillars arranged to extend in a second direction that intersects the first direction, and to pass the conductive layers, wherein the plurality of memory cells are arranged at intersections of the conductive layers and the pillars.

* * * * *